US006771101B1

(12) United States Patent
Doyle

(10) Patent No.: US 6,771,101 B1
(45) Date of Patent: Aug. 3, 2004

(54) CMOS REFERENCE CIRCUIT USING FIELD EFFECT TRANSISTORS IN LIEU OF RESISTORS AND DIODES

(75) Inventor: James T. Doyle, Nederland, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/226,523

(22) Filed: Aug. 22, 2002

Related U.S. Application Data

(63) Continuation-in-part of application No. 10/142,083, filed on May 8, 2002, now Pat. No. 6,617,836.

(51) Int. Cl.[7] .................................................. H03L 7/00
(52) U.S. Cl. ....................................................... 327/142
(58) Field of Search ................................ 323/313–316, 323/364, 281; 327/142, 143, 198

(56) References Cited

U.S. PATENT DOCUMENTS 4,641,081 A * 2/1987 Sato et al. .................. 323/313
4,814,686 A * 3/1989 Watanabe .................... 323/229
4,833,342 A * 5/1989 Kiryu et al. ................ 327/541
4,868,484 A * 9/1989 Seo et al. ................... 323/314
5,493,207 A * 2/1996 Beasom ...................... 323/313

* cited by examiner

*Primary Examiner*—Shawn Riley

(57) ABSTRACT

A CMOS reference circuit using field effect transistors (FETs) is described. A first plurality of FETs is coupled in series, source node to drain node. A second plurality of FETs is also coupled in series, source node to drain node. The first and second plurality of FETs are coupled such that a specified total voltage drop across the first plurality of FETs is realizable. The combination of the first and second plurality of FETs are usable as a replacement for a resistor. The circuit can also include a FET configured so that it is usable as a replacement for a diode.

24 Claims, 34 Drawing Sheets

1500

CM OS REFERENCE CIRCUIT USING FIELD EFFECT TRANSISTORS IN LIEU OF RESISTORS AND DIODES

CROSS REFERENCE TO RELATED APPLICATION

This Application is a Continuation-in-Part of, commonly-owned U.S. patent application Ser. No. 10/142,083, filed May 8, 2002, now U.S. Pat. No. 6,617,836, by James T. Doyle et al., and entitled "A CMOS Sub-Bandgap Reference with an Operating Supply Voltage Less Than the Bandgap Potential."

TECHNICAL FIELD

Embodiments of the present invention pertain to integrated circuits. Specifically, embodiments of the present invention pertain to bandgap and sub-bandgap reference circuits.

BACKGROUND ART

Many contemporary CMOS (complementary metal-oxide silicon) integrated circuit chips contain a large digital core along with some peripheral analog circuitry. The analog circuitry typically includes reference voltage circuits that are relied upon by various analog blocks and/or by select digital circuits. These reference voltage circuits should optimally provide a stable, dependable and accurate reference voltage.

One of the most widely adopted reference voltage circuits is referred to as a "bandgap" circuit. The bandgap circuit is based on an established physical phenomenon exhibited by silicon. Basically, silicon has a bandgap potential of 1.21 volts. The bandgap potential of silicon can be exploited to produce an extremely reliable and tight reference voltage.

According to the prior art, in order to produce a bandgap reference voltage of 1.21 volts, an operating supply voltage of 1.5 volts or greater is typically required in order to provide a margin of overhead. The majority of analog CMOS circuits today operate at a voltage of three (3) volts, which amply meets the needs of conventional bandgap circuits. However, advances in technology that have resulted in smaller and faster digital circuitry are pushing analog counterparts to keep pace. This, combined with a desire to reduce the voltage and current (i.e., power) requirements, is pushing analog circuitry to operate at voltages as low as one (1) volt, and perhaps even less than 1 volt. Quite obviously, this is less than the bandgap potential of 1.2 volts. To reduce the operating supply voltage to below the bandgap potential, sub-bandgap circuits that can provide a stable reference voltage with an operating supply voltage less than the bandgap potential are also being realized.

Previously, bandgap and sub-bandgap circuits have been realized with combinations of capacitors, diodes, bipolar devices, and resistors. Cost pressures coupled with the process complexity of deep sub-micron technology (e.g., less than 0.12 micron) are starting to make the use of passive devices prohibitive. Moreover, passive devices generally tend to reduce the speed of the circuit and are relatively large. Accordingly, bandgap and sub-bandgap circuits that provide a solution to these problems would be desirable.

SUMMARY OF THE INVENTION

Embodiments of the present invention pertain to a reference circuit—specifically, a precision CMOS circuit—that uses field effect transistors (FETs) in lieu of resistors and diodes. A first plurality of FETs is coupled in series, source node to drain node. A second plurality of FETs is also coupled in series, source node to drain node. The source node of a FET in the second plurality of FETs is coupled to the gate node of a respective FET in the first plurality of FETs. The gate node of each FET in the second plurality of FETs is coupled to ground such that a specified total voltage drop across the first plurality of FETs is realizable. The combination of the first and second plurality of FETs are usable as a replacement for a resistor. The circuit can also include a FET configured so that it is usable as a replacement for a diode. Accordingly, parasitics that can affect circuit performance are minimized. Furthermore, with the drive to smaller scale processes and faster circuits, future technologies are making analog design more difficult, and the use of FETs in place of diodes, resistors and capacitors helps alleviate that difficulty.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Embodiments of an ultra-low power complementary metal-oxide silicon (CMOS) reference circuit are described herein. In these embodiments, the reference circuit may utilize only field effect transistors (FETs) in place of resistors and diodes (and in the absence of capacitors, bipolar devices, etc.). In the following detailed description of the present invention, numerous specific details are set forth in order to provide a thorough understanding of the present invention. However, the present invention may be practiced without these specific details or by using alternate elements or methods. In other instances, well-known methods, procedures, components, and circuits have not been described in detail as not to unnecessarily obscure aspects of the present invention.

Features of the present invention are described in the context of a sub-bandgap reference circuit. However, one skilled in the art will understand that alternate implementations are possible. For example, a bandgap reference circuit may incorporate the features of the present invention. Generally speaking, the features of the present invention pertain to the judicious use of FETs in a manner that overcomes the need for components such as resistors, capacitors, and diodes.

Embodiments of a CMOS circuit that can provide a sub-bandgap reference voltage utilizing resistors and diodes are first described. Then, embodiments of a circuit that may utilize FETs in lieu of the resistors and/or diodes are described.

A CMOS SUB-BANDGAP REFERENCE WITH AN OPERATING SUPPLY VOLTAGE LESS THAN THE BANDGAP POTENTIAL

As an overview, in its various embodiments, the sub-bandgap circuit described herein provides a stable reference voltage (plus/minus one percent, untrimmed) over process temperatures ranging from approximately −40° C. to 125° C. and voltages ranging from approximately 1.1 to 5.5 volts. According to these embodiments, the sub-bandgap circuit can be integrated with deep sub-micron (e.g., 0.12 micron) digital processes, while providing ultra-low power analog circuits in higher threshold CMOS processes generally used for power regulation and power management. In one embodiment, the sub-bandgap circuit comprises a 0.5-micron N-well CMOS with high threshold voltage (on the order of one volt) and high breakdown voltage (on the order of 5.5 volts).

Figure 1:
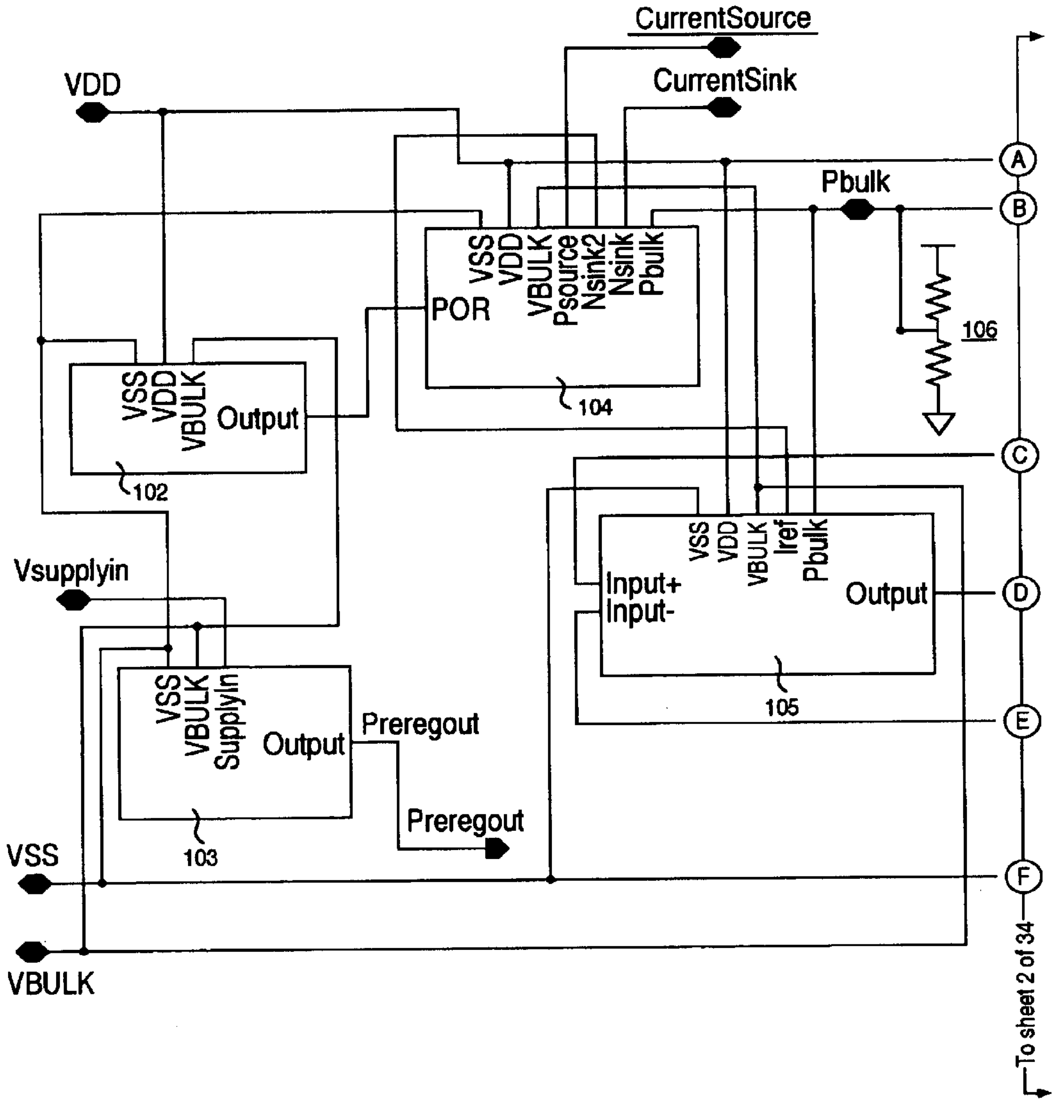
FIG. 1 is a schematic diagram of one embodiment of a sub-bandgap circuit.
Figure 1:
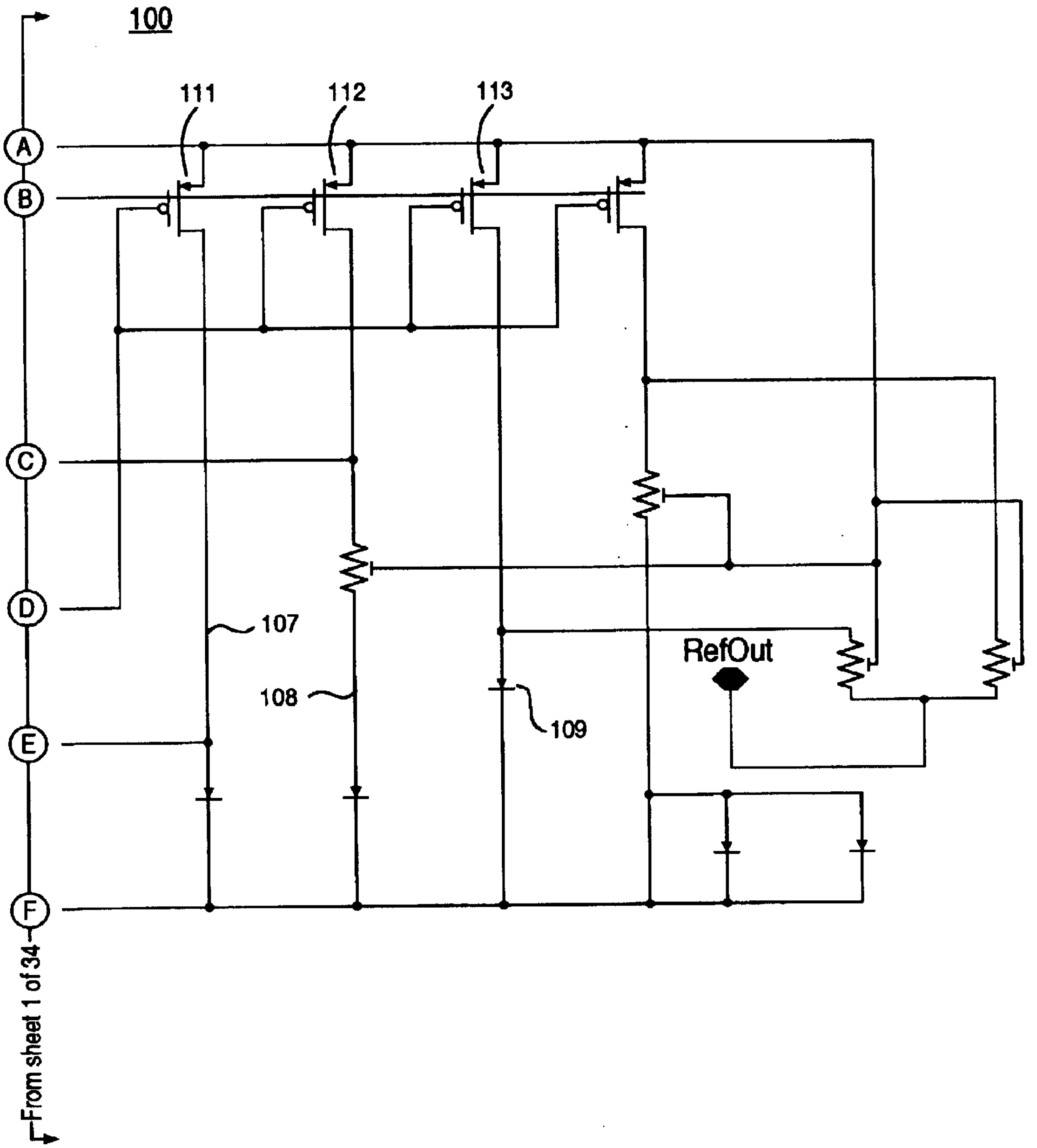

FIG. 1 shows a top-level schematic illustrating one embodiment of a sub-bandgap circuit 100. In this embodiment, sub-bandgap circuit 100 includes a power-on reset (POR) block 102, a pre-regulator block 103, a current source block 104, and an operational amplifier block 105. In one embodiment, P-channel bulk (P-bulk) of the current source block 104 and the operational amplifier block 105 are coupled to an external resistor divider 106, comprising a pair of 1-Meg Ω resistors. The resistor divider potential lowers the effective threshold voltage (Vt) and thereby promotes lower voltage operation.

In the present embodiment, current mirroring is used in place of voltage gain to increase the starting diode voltage drop ΔVbe (the voltage between the base and the emitter) of the diodes in current legs 107 and 108. In this embodiment, a current leg 109 is included in addition to the current legs 107 and 108. Current legs 107 and 108 are "inside the loop," coupled to the input of operational amplifier 105 while being driven by the output of operational amplifier 105. Current leg 109 is "outside the loop," and compensates for stability problems that otherwise can be present in a circuit operating at voltages and powers as low as those being used by sub-bandgap circuit 100.

According to the present embodiment, a current mirroring gain of a factor of approximately six is achieved, bringing the starting ΔVbe up to about 100 milli-volts with a diode ratio approximately of eight-to-one on the current legs 107 and 108. The ΔVbe and the current legs 107 and 108 can be adjusted to have approximately the same current, which directly lends itself to resistor divider averaging.

A sub-bandgap circuit develops a negative temperature coefficient by applying a constant temperature to a diode. The negative temperature coefficient is precisely canceled by the positive coefficient of a ΔVbe reference. Vbe is averaged with a multiplied version of the ΔVbe reference, both of which are about 0.612 volts or one-half of the bandgap potential (Vbg). Because the sum is constant, the average is constant if both voltages are equal (e.g., at room temperature). The averaging nature of this approach ((Vbe+ΔVbe·A)/2) reduces the sensitivity to manufacturing tolerances, resulting in an inherent improvement in yields and reduced sensitivities to process voltages and temperatures (PVT).

Also, the P-channel mirror devices 111, 112 and 113 can have their bulk node tied at a lower potential, on the order of one-half of VDD, reducing a normal P-channel threshold voltage of one volt to approximately 0.7 volts; this lower voltage can be used for all of the P-channel devices in the sub-bandgap circuit. Generally, for many CMOS processes, the N-channel threshold voltage is less than that of the P-channel. For N-channel devices, the threshold is lowered by minimizing channel length and sub-threshold current. N-channel devices having a large channel width in conjunction with minimal channel length can effectively lower the voltage threshold by about 200 milli-volts over Vto.

Figure 2:
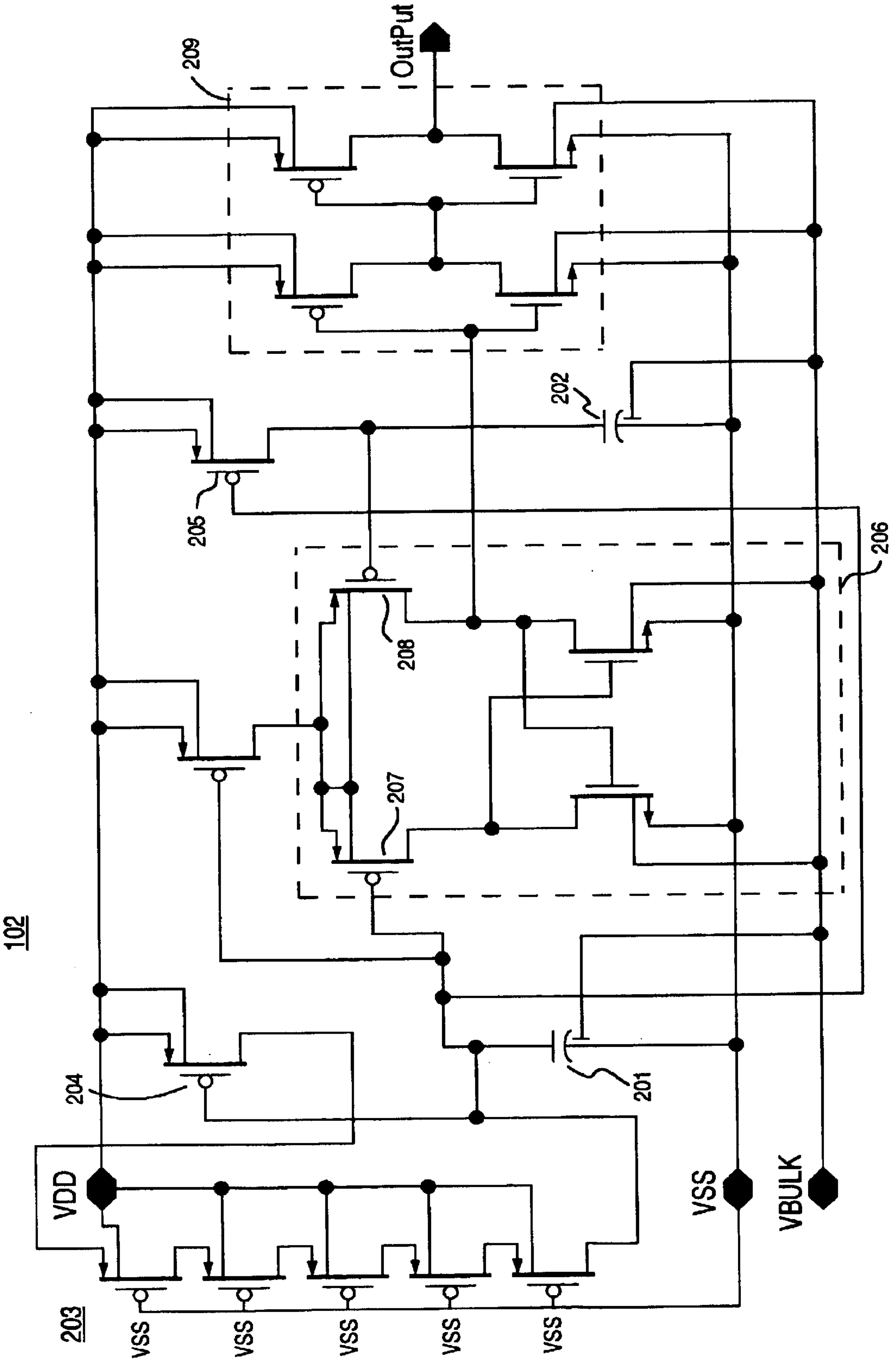
FIG. 2 is a schematic diagram of one embodiment of a power-on reset that may be implemented as part of the present invention.

FIG. 2 is a schematic diagram of one embodiment of POR 102 that may be implemented as part of the present invention. POR 102 is used for system level reset and state initialization. POR 102 is a zero-current POR that promotes ultra-low voltage startup using a threshold and saturation voltage crossover scheme. It should be noted that POR 102 can feasibly operate to a 1-volt supply using conventional device operating regions. In the present embodiment, this is achieved using differentially charging capacitors 201 and 202 that have different turn-on thresholds; accordingly, there is no need for body biasing to Gmb (body transconductance)

operation. In this embodiment, a first time constant is provided by the field effect transistors (FETs) 203 and 204 and capacitor 201, and a second, slower time constant is provided by FET 205 and capacitor 202. When the power supply comes up, a comparison between these two time constants determines when the power is high enough to ensure proper sub-bandgap operation. A latch 206 is then triggered which pulls the sub-bandgap circuit 100 into its optimal operating range.

Once the sub-bandgap circuit 100 is reset, the latch 206 reverts to a standby mode. While in standby, the latch 206 consumes no current because the two P-channel transistors 207 and 208 are turned off, thereby promoting the extremely low power and current characteristics achieved in accordance with the present invention. Latch 206 stores states and is relatively immune to common mode noise sources such as supply glitches. A pair of inverters 209 is coupled to the output of latch 206.

Figure 3:
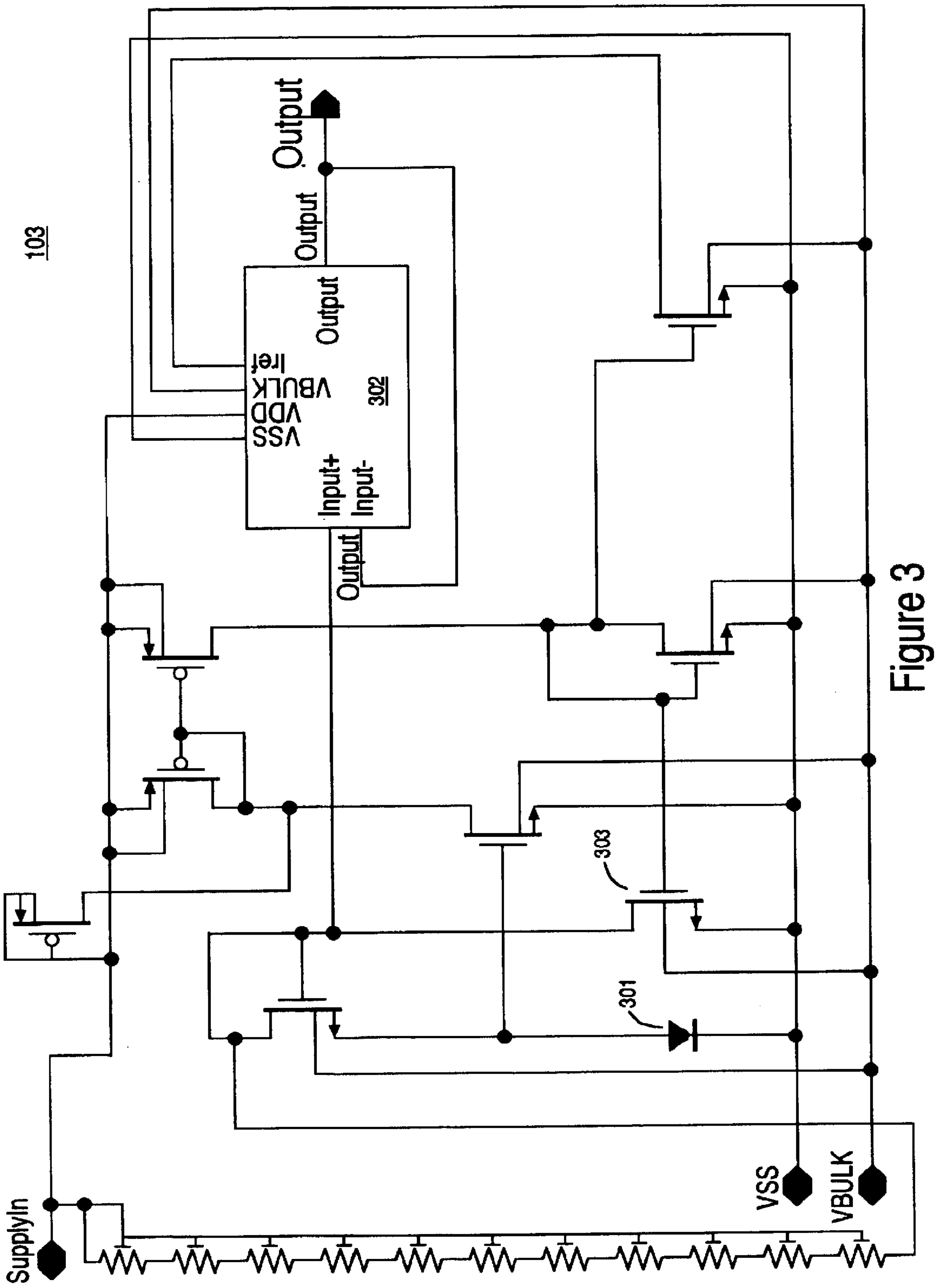
FIG. 3 is a schematic diagram of one embodiment of a pre-regulator that may be implemented as part of the present invention.

FIG. 3 is a schematic diagram of one embodiment of a pre-regulator 103 that may be implemented as part of the present invention. Pre-regulator 103 takes a voltage supply input (Vsupplyin) and regulates it down to a targeted voltage (Preregout). Pre-regulator 103 promotes operation of low voltage circuits up to 5.5 volts, which is typical of CMOS applications. In the present embodiment, pre-regulator 103 includes a current reference with voltage regulation based on a diode 301. In this embodiment, a stack-up of FETs and a unity gain amplifier 302 follow the reference. In addition, according to the present embodiment, temperature compensation is provided by FET 303. Thereby, the pre-regulator can regulate low voltage circuits (e.g., less than 5.5. volts) that may be used with CMOS applications. Also, pre-regulator 103 consumes less than 10 μA, which is significantly less than conventional designs which typically consume 100 μA or more. Pre-regulator 103 improves DC PSRR (the power supply rejection ratio) by more than 20 decibels (dB).

Figure 4:
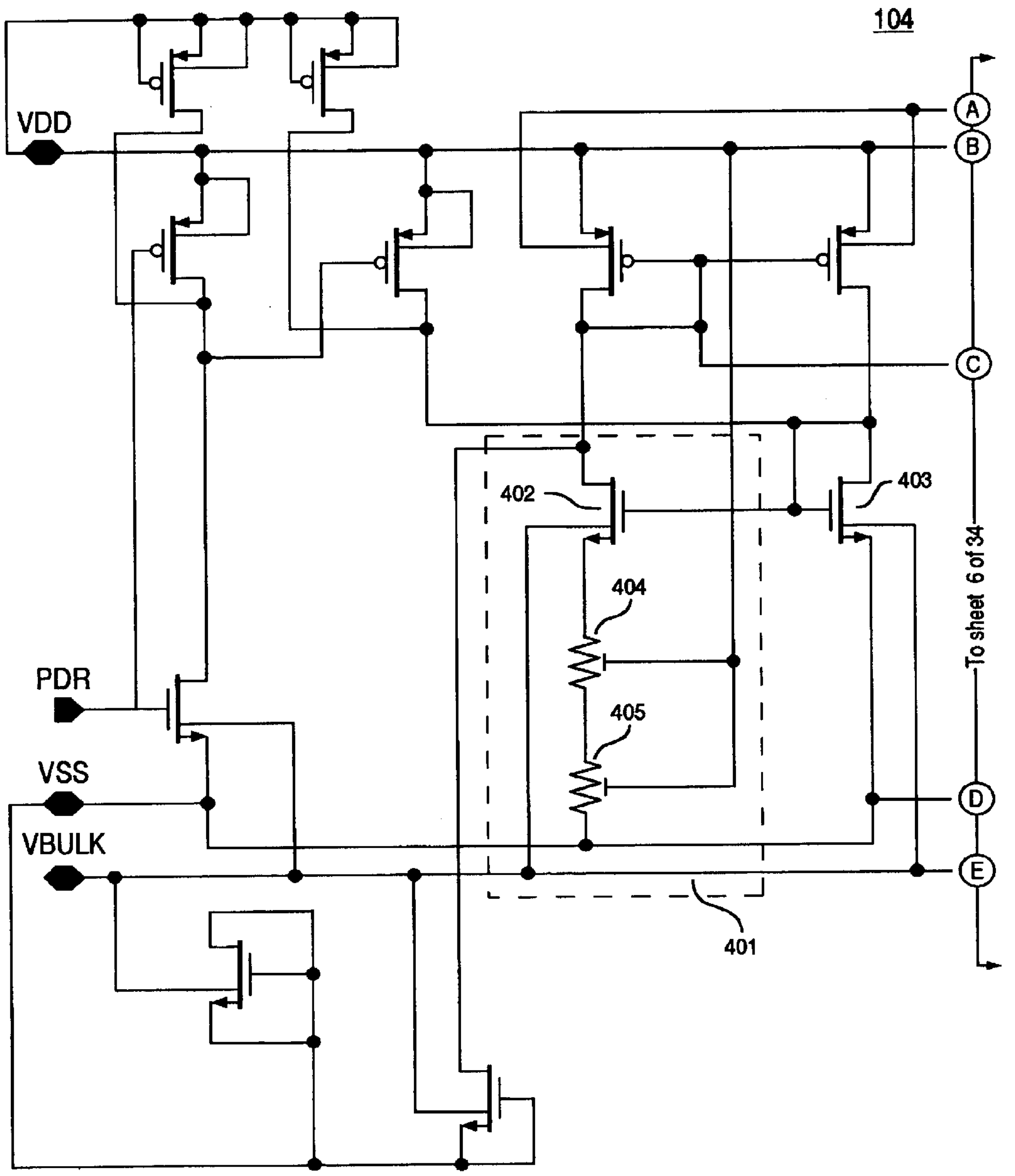
FIG. 4 is a schematic diagram of one embodiment of a current source that may be implemented as part of the present invention.
Figure 4:
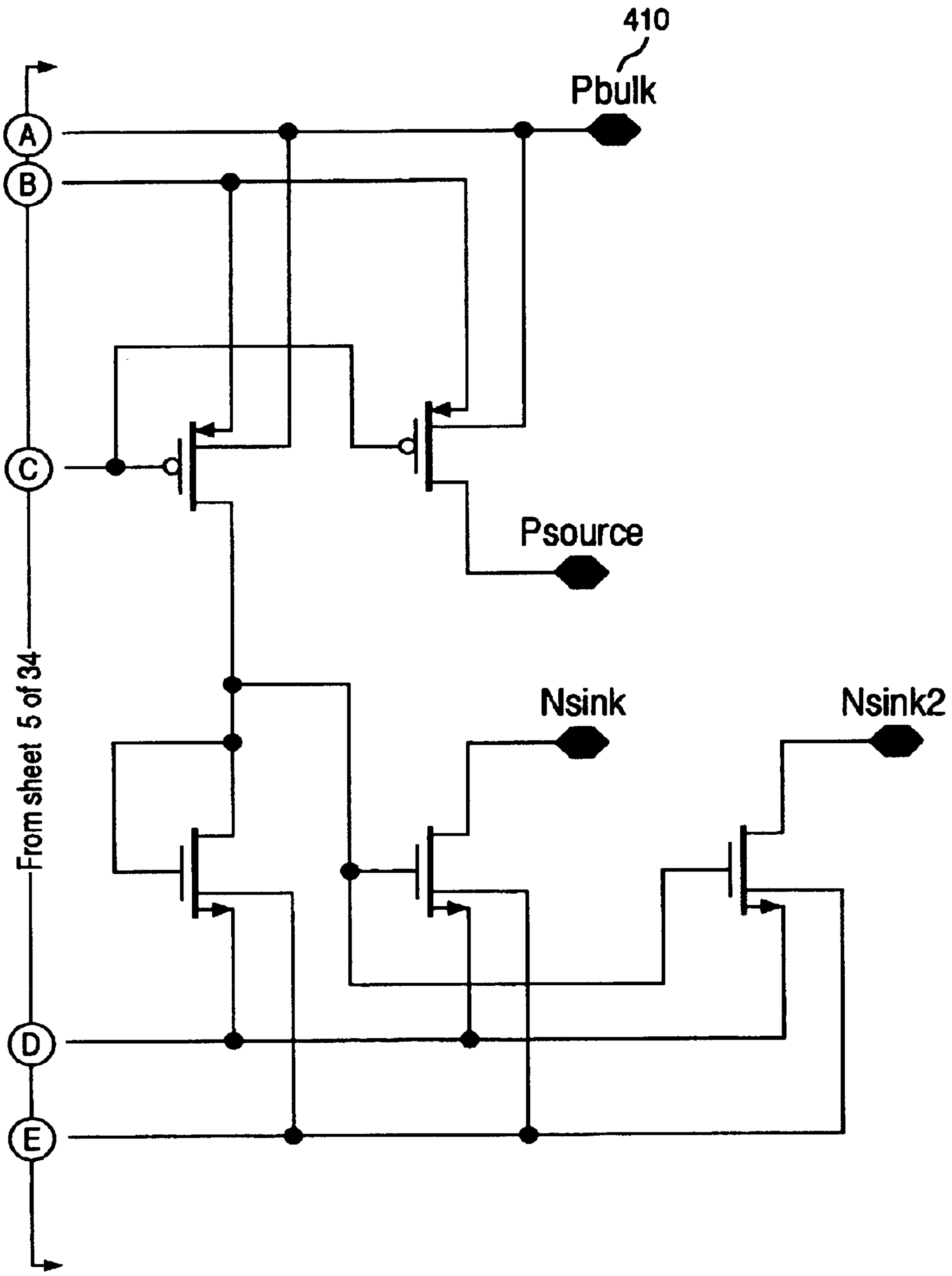

FIG. 4 is a schematic diagram of one embodiment of a current source 104 that may be implemented as part of the present invention. This current source provides an accurate supply-independent current source, to voltages at least as low as approximately one volt. In the present embodiment, current source 104 incorporates a PTAT (proportional to absolute temperature) Vittoz source 401. Utilization of the PTAT current effectively compensates for process and temperature effects normally associated with sub-threshold operation. In one embodiment, sub-threshold current biases that track the normal variations in process and temperature are applied. In one embodiment, a PTAT current of 640 nano-amps is used.

In one embodiment, an area ratio of four-to-one is selected for N-channel transistors 402 and 403 to provide sufficient loop gain with relatively low resistor values. In this embodiment, the channel width of transistor 402 is 120μ, the channel width of transistor 403 is 30μ, resistor 404 is approximately 50KΩ, and resistor 405 is approximately 150KΩ.

Of significance, according to the present embodiment of the present invention, the P-channel bodies (P-bulk 410) in the current source are forward-biased. This reduces the effect of high threshold voltage in the weak inversion region of operation. For a P-channel FET in an N-well process, the bulk (or body) can be used as an input control node. With the gate tied to ground (e.g., with the device on all the time), the bulk can be used as an input port because the source is reverse-biased or only slightly forward-biased. This mode of operation has gain that is based on Gmb instead of on Gm (the "short circuit" transconductance). For most processes, this conductance is a factor of about ten lower for a given current; however, in one embodiment, folded cascading techniques are used to provide two-stage gains in excess of 90 dB with a supply operating voltage below the threshold voltage. This mode of operation can reduce bandwidth and drive capability; however, the decreased bandwidth can be beneficial because it results in lower noise bandwidth, so that operational amplifier 105 (FIG. 1) can actually serve as a noise filter. Furthermore, techniques such as double-correlated sampling and chopper averaging can be used effectively to reduce noise.

Figure 5:
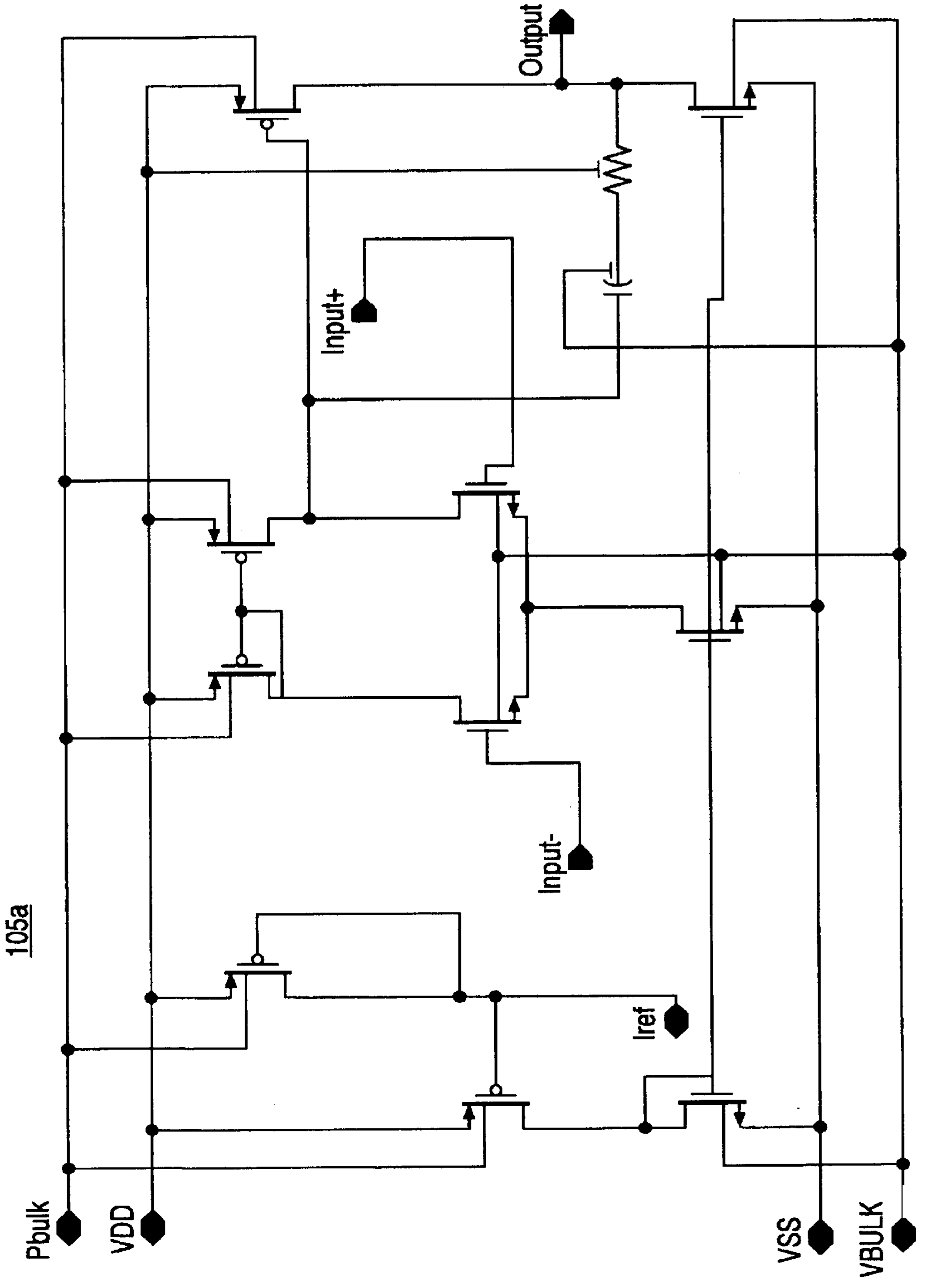
FIG. 5 is a schematic diagram of one embodiment of an operational amplifier that may be implemented as part of the present invention.
Figure 9:
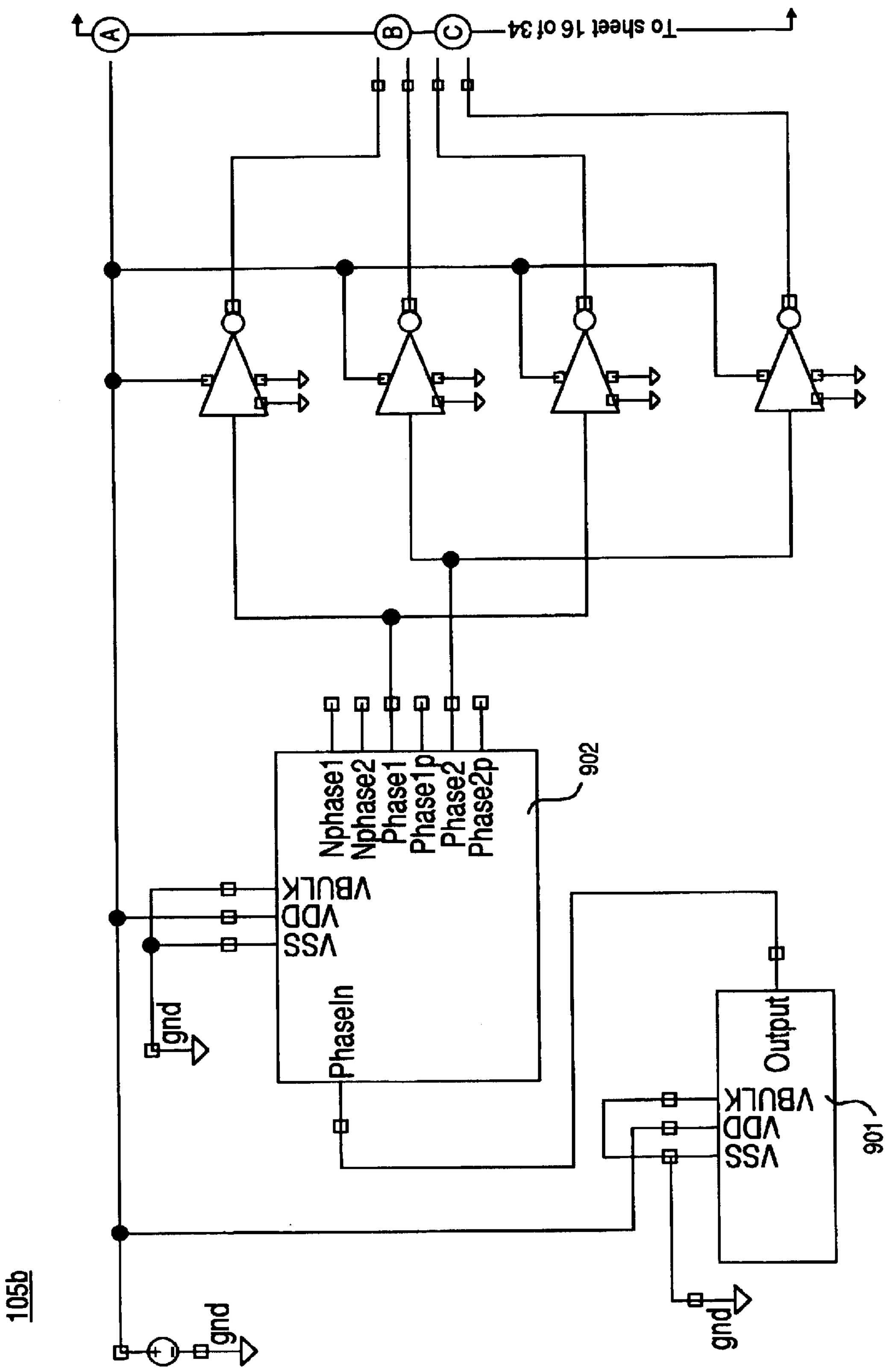
FIG. 9 is a schematic diagram of another embodiment of an operational amplifier that may be implemented as part of the present invention.
Figure 9:
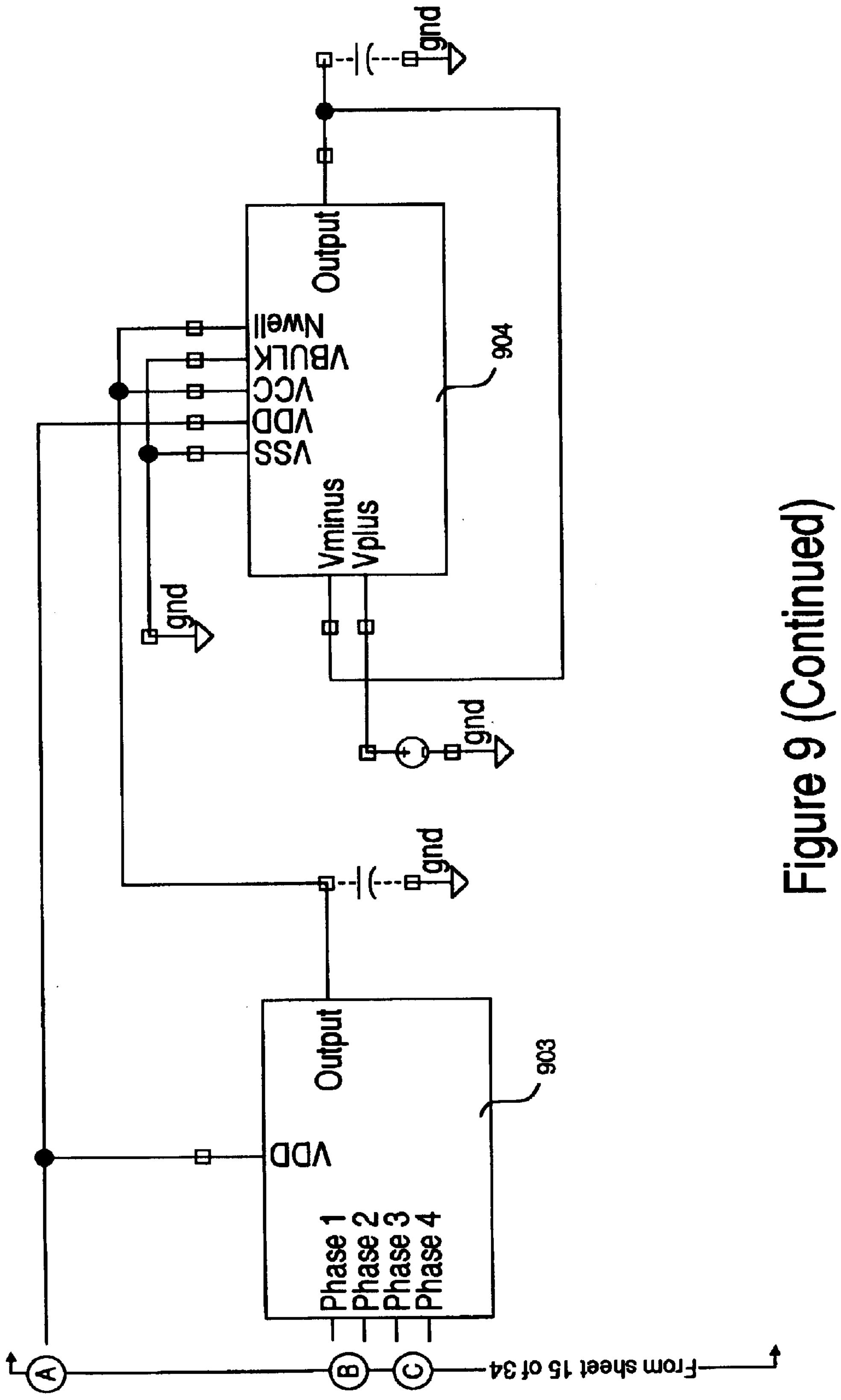

FIG. 5 is a schematic diagram of one embodiment of an operational amplifier (op-amp) 105*a* that may be implemented as part of the present invention. Another embodiment of an op-amp (105*b*) that may be implemented as part of the present invention is illustrated in FIG. 9. It should be mentioned that, in some applications, lower performance amplifiers can be used, resulting in area savings and reduced design risk. That is, different amplifiers can be selected for use depending on the application of the sub-bandgap circuit.

Generally speaking, it is desirable to increase the DC loop gain to the greatest extent possible because an error in this gain translates directly into offset error. Also, because absolute gain may not be adequately controlled over PVT, excess gain may be required. In the present embodiment, an N-channel input stage, operating in the sub-threshold region, is used because it provides added robustness for process voltage and temperature effects relative to a P-channel input stage. However, a P-channel input stage can provide advantages over an N-channel input stage, depending on the starting point of the processes. It should be noted that, in many CMOS applications, the thresholds of the N-channel and P-channel are asymmetric, with the threshold of the N-channel generally lower than that of the P-channel. In a symmetric threshold process, a P-channel input stage is expected to be advantageous.

Figure 6:
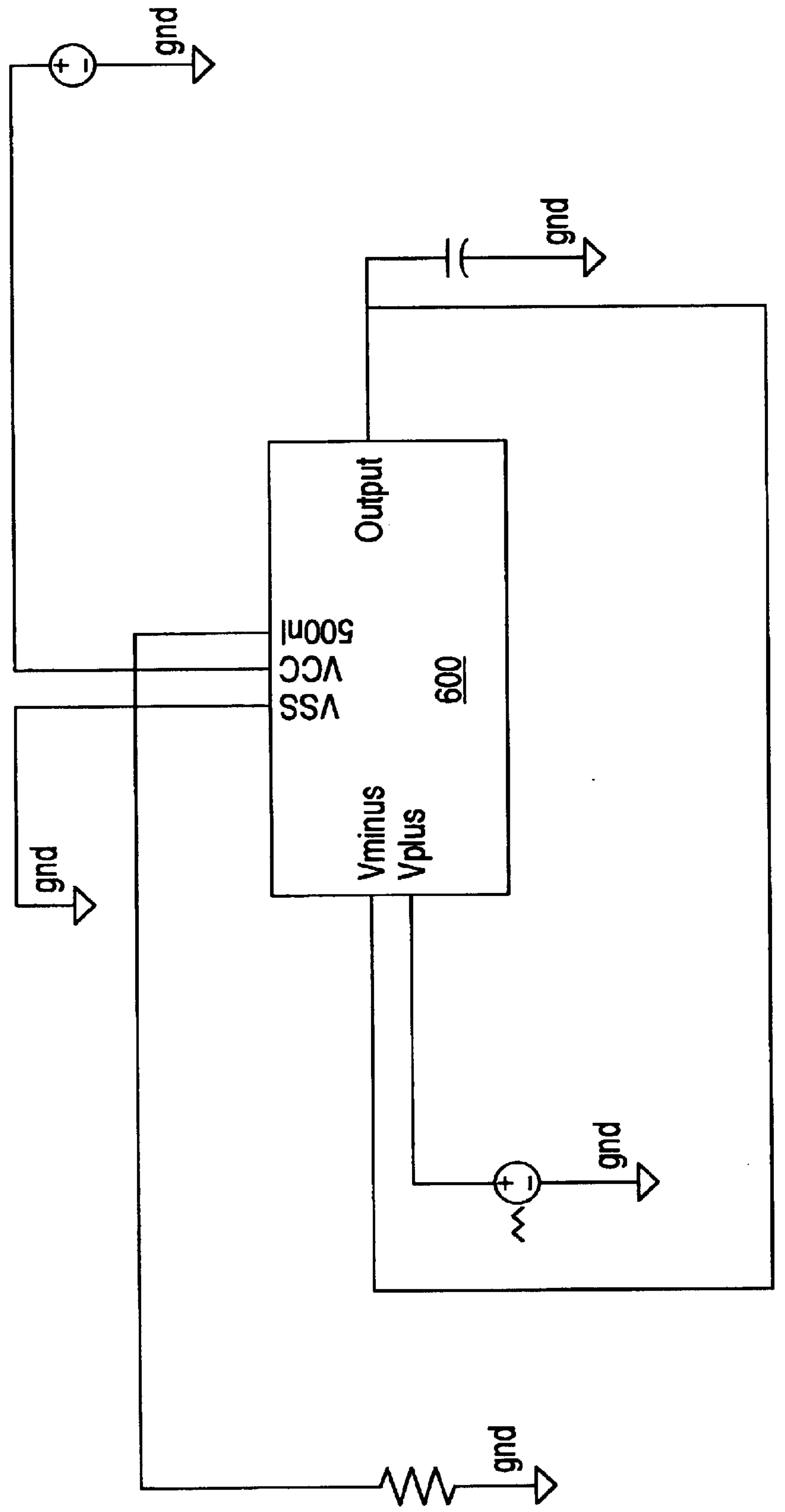
FIG. 6 is a schematic diagram of one embodiment of an input stage for the operational amplifier of FIG. 5 that may be implemented as part of the present invention.

FIG. 6 is a schematic diagram of one embodiment of an input stage 600 for the operational amplifier of FIG. 5 that may be implemented as part of the present invention. Input stage 600 is Gmb-based and provides a DC gain of over 90 dB.

Figure 7:
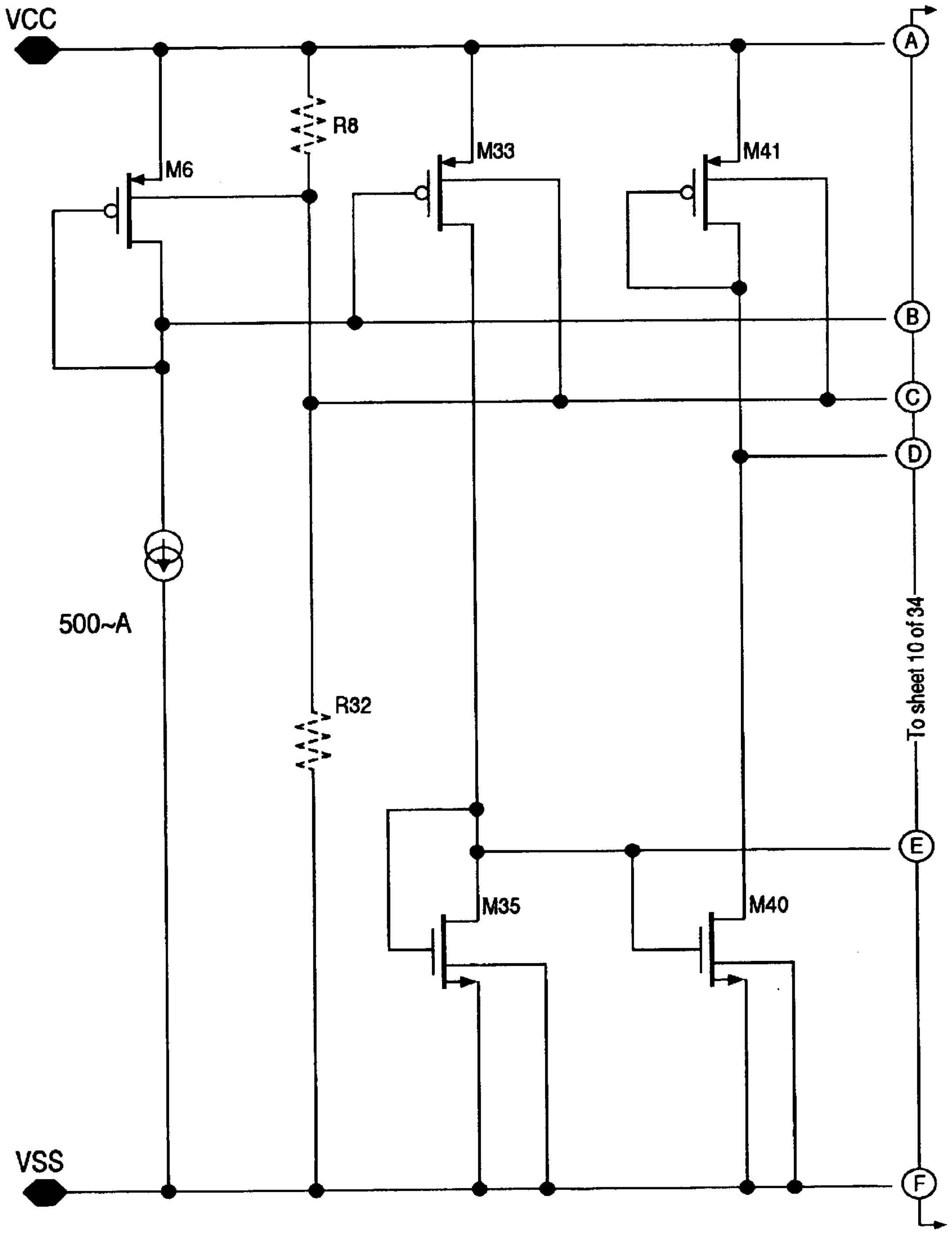
FIG. 7 is a schematic diagram further illustrating one embodiment of an input stage for the operational amplifier of FIG. 5 that may be implemented as part of the present invention.
Figure 7:
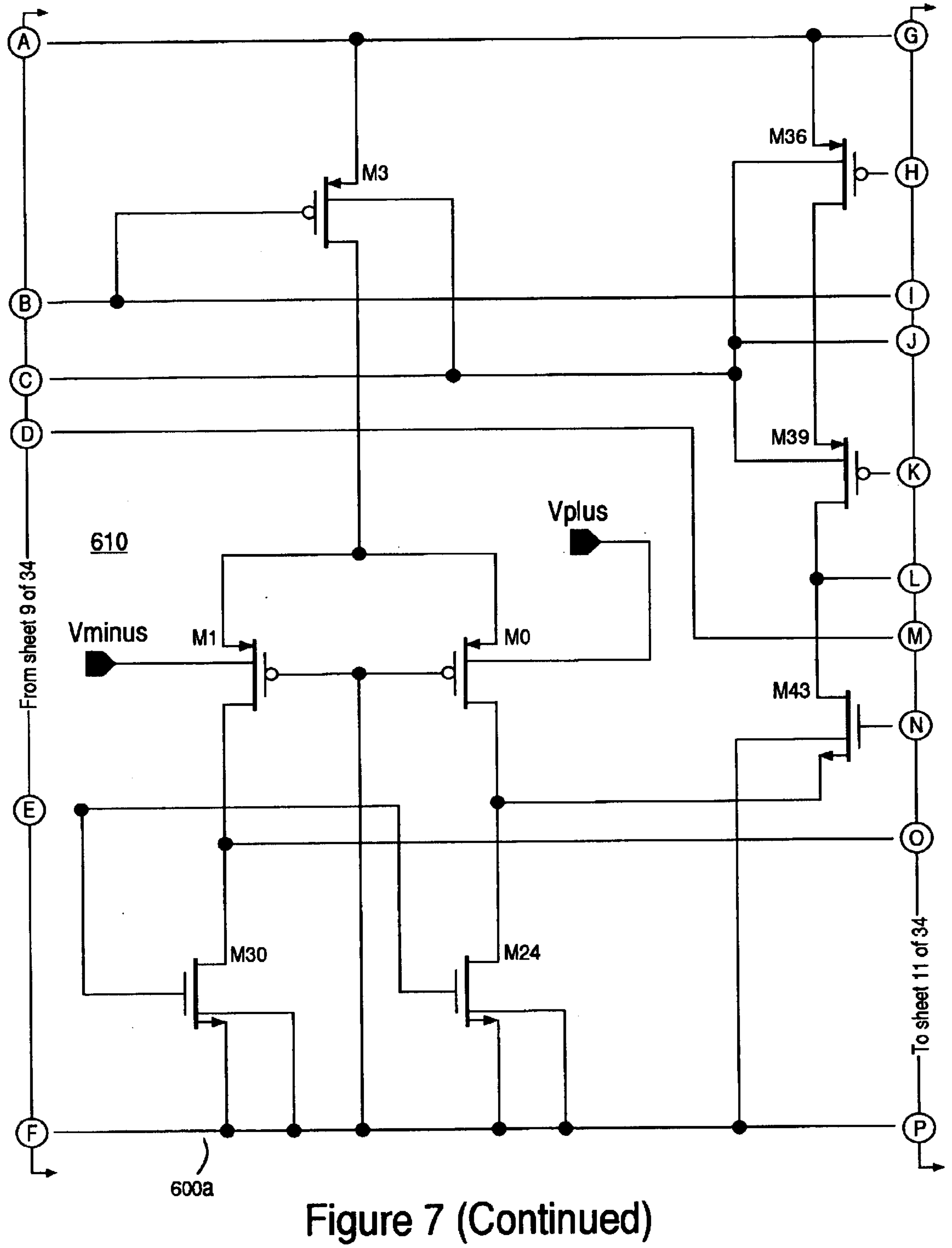
Figure 7:
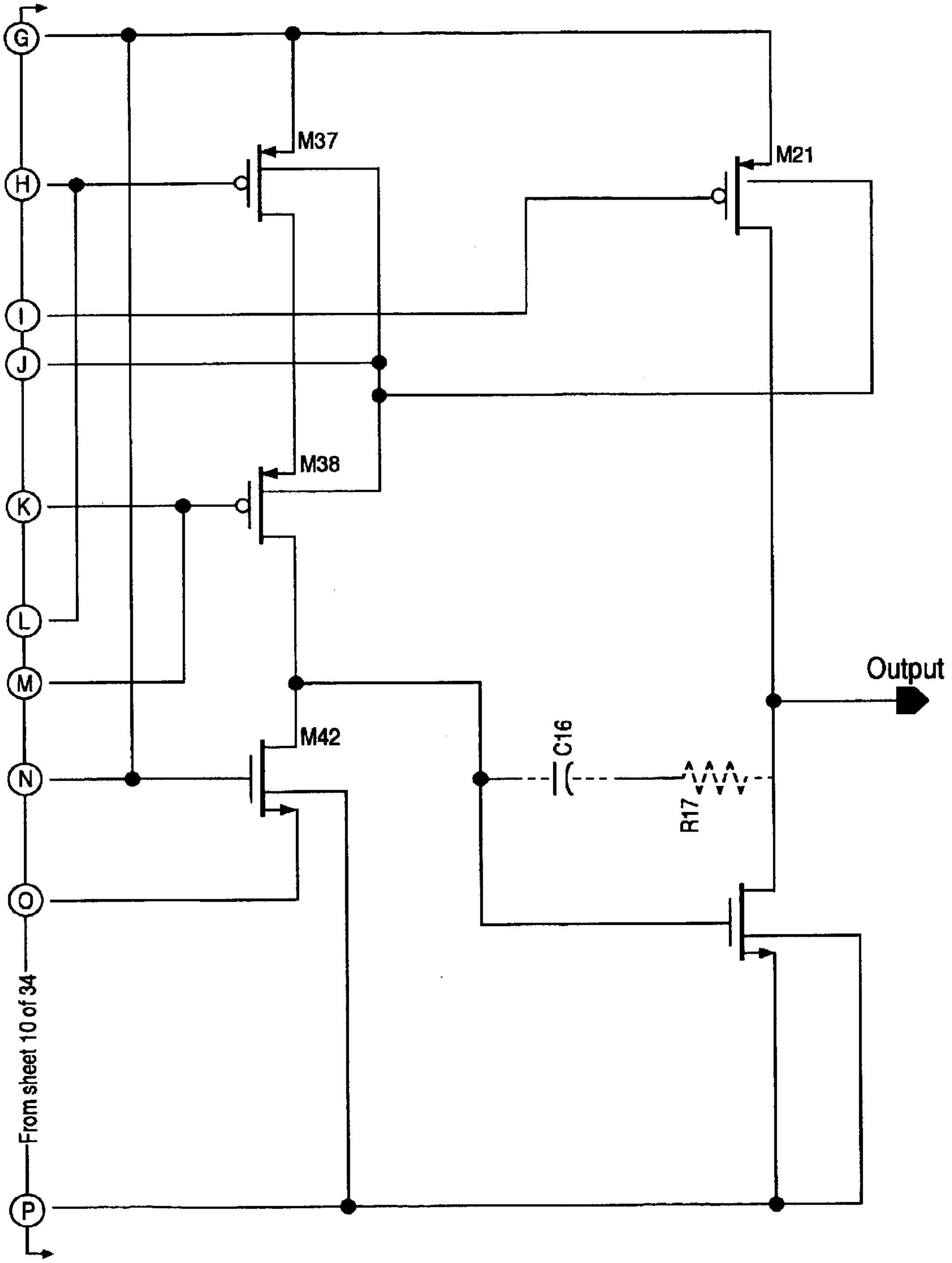
Figure 8:
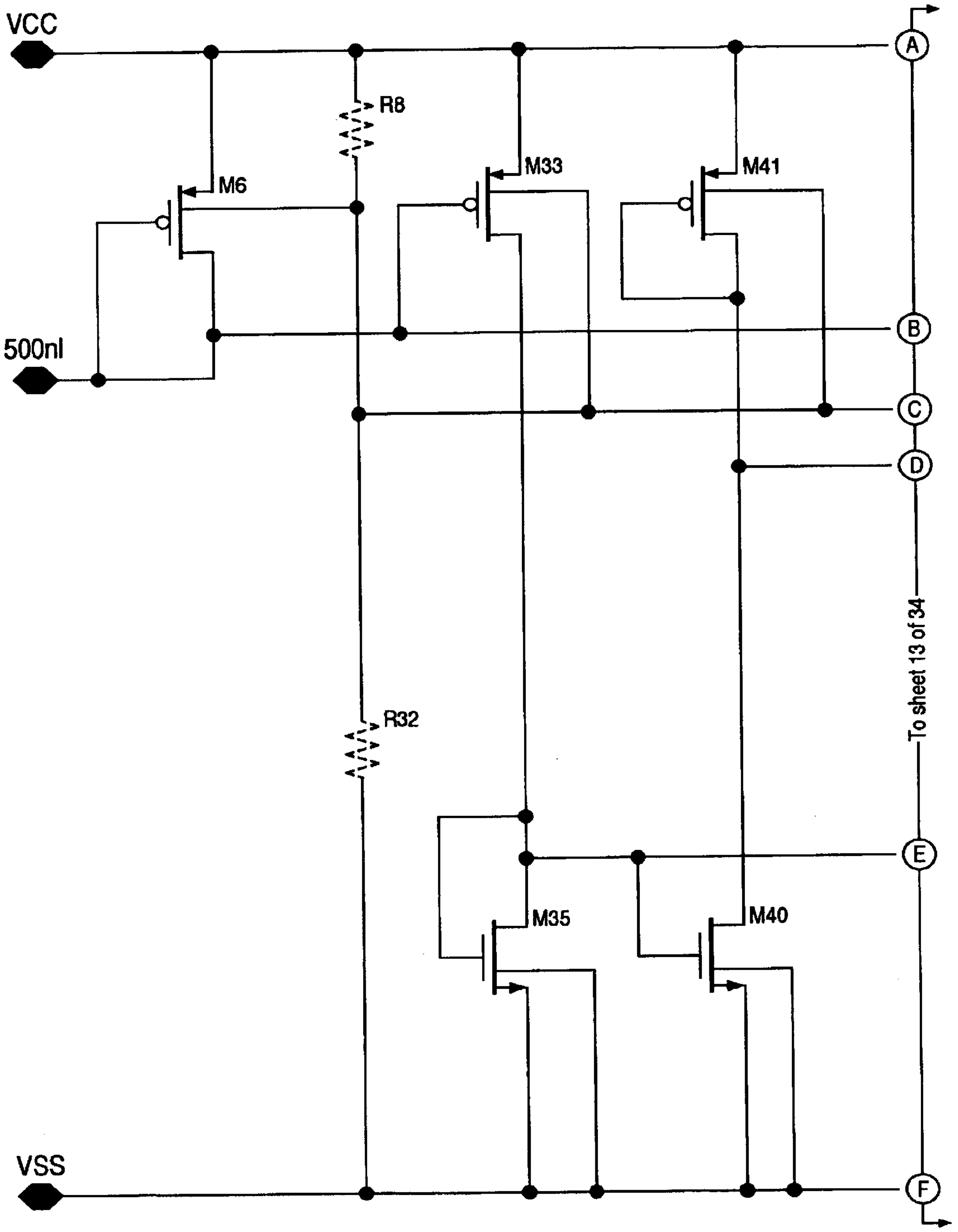
FIG. 8 is a schematic diagram further illustrating another embodiment of an input stage for the operational amplifier of FIG. 5 that may be implemented as part of the present invention.
Figure 8:
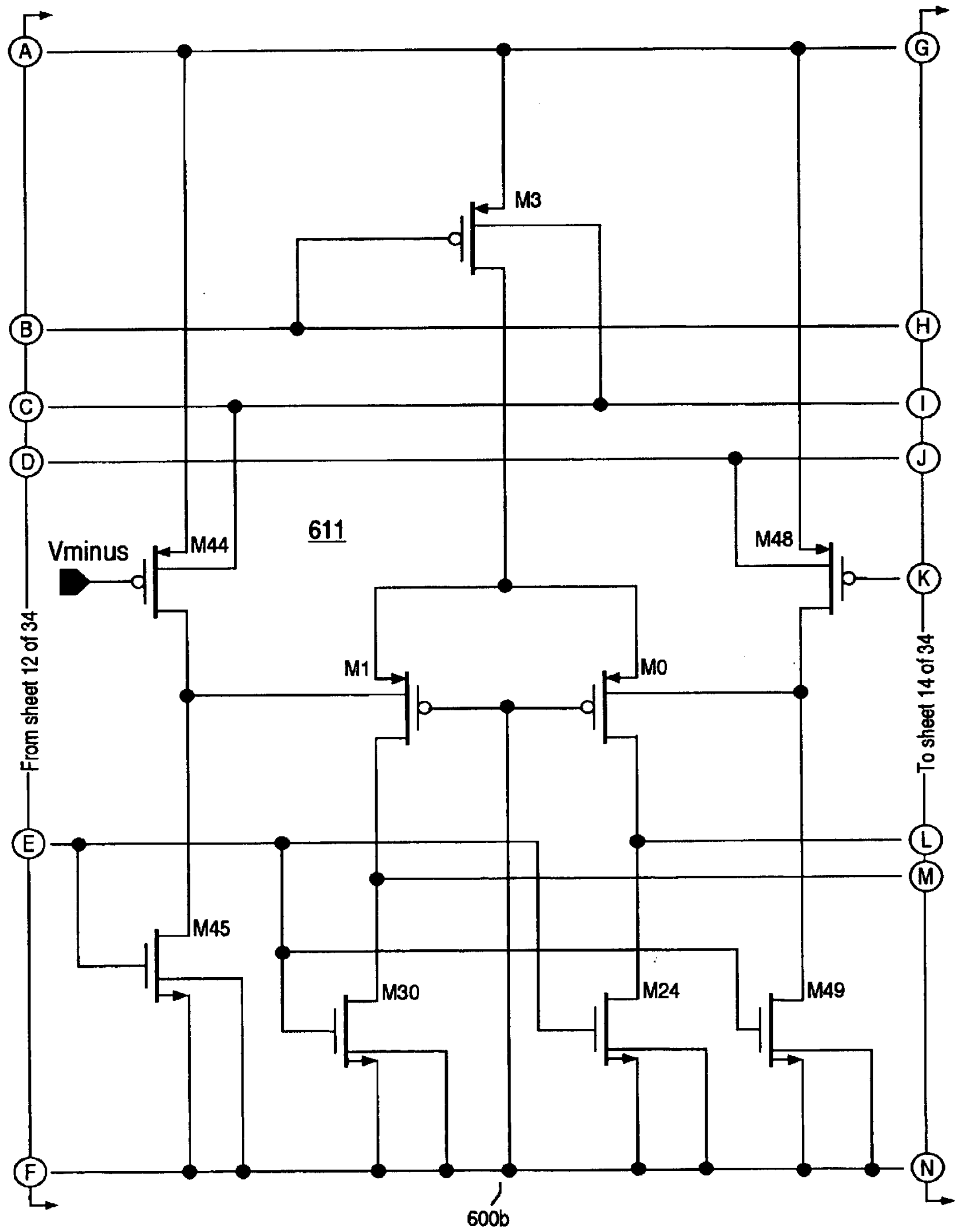
Figure 8:
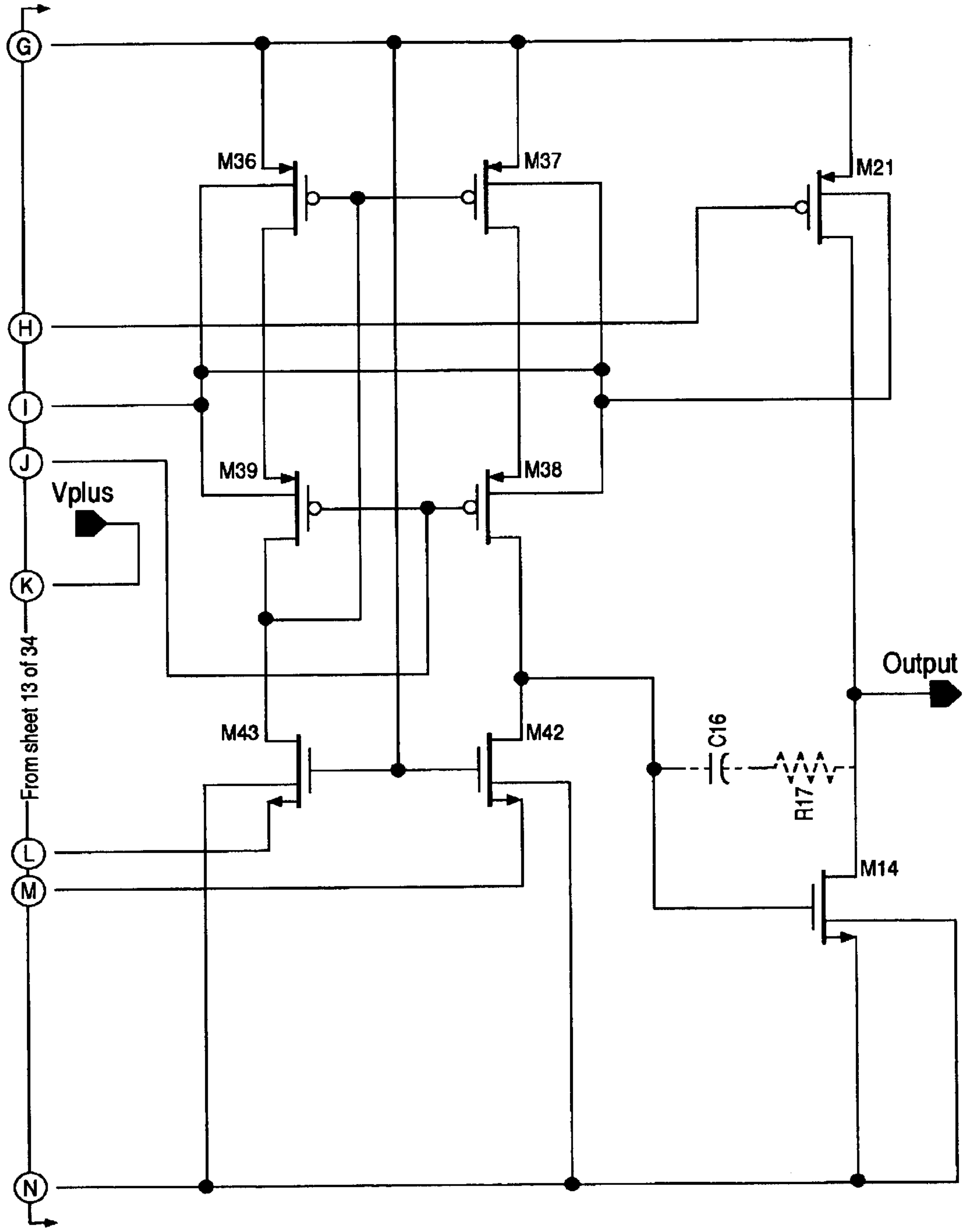

FIG. 7 is a schematic diagram further illustrating one embodiment of an input stage 600*a* for the operational amplifier of FIG. 5 that may be implemented as part of the present invention. FIG. 8 is a schematic diagram further illustrating another embodiment of an input stage 600*b* for the operational amplifier of FIG. 5 that may be implemented as part of the present invention. Input stage 600*a* is based on a direct junction input 610 while input stage 600*b* includes a P-channel level shifter/current buffer 611.

FIG. 9 is a schematic diagram of one embodiment of an operational amplifier 105*b* that may be implemented as part of the present invention. In the present embodiment, full rail-to-rail operation is achieved with a supply voltage of less than one volt. In this embodiment, op-amp 105*b* includes an oscillator 901, a phase generator 902, a one-volt doubler 903, and an input stage 904. Op-amp 105*b* as illustrated in FIG. 9 is used by circuit 100 to realize an accurate sub-bandgap voltage in accordance with the present invention. Operational amplifier 105*b* realizes sub-one volt operation by making use of back gating (Gmb) as the input stage, allowing full rail-to-rail input and output swings.

Figure 10:
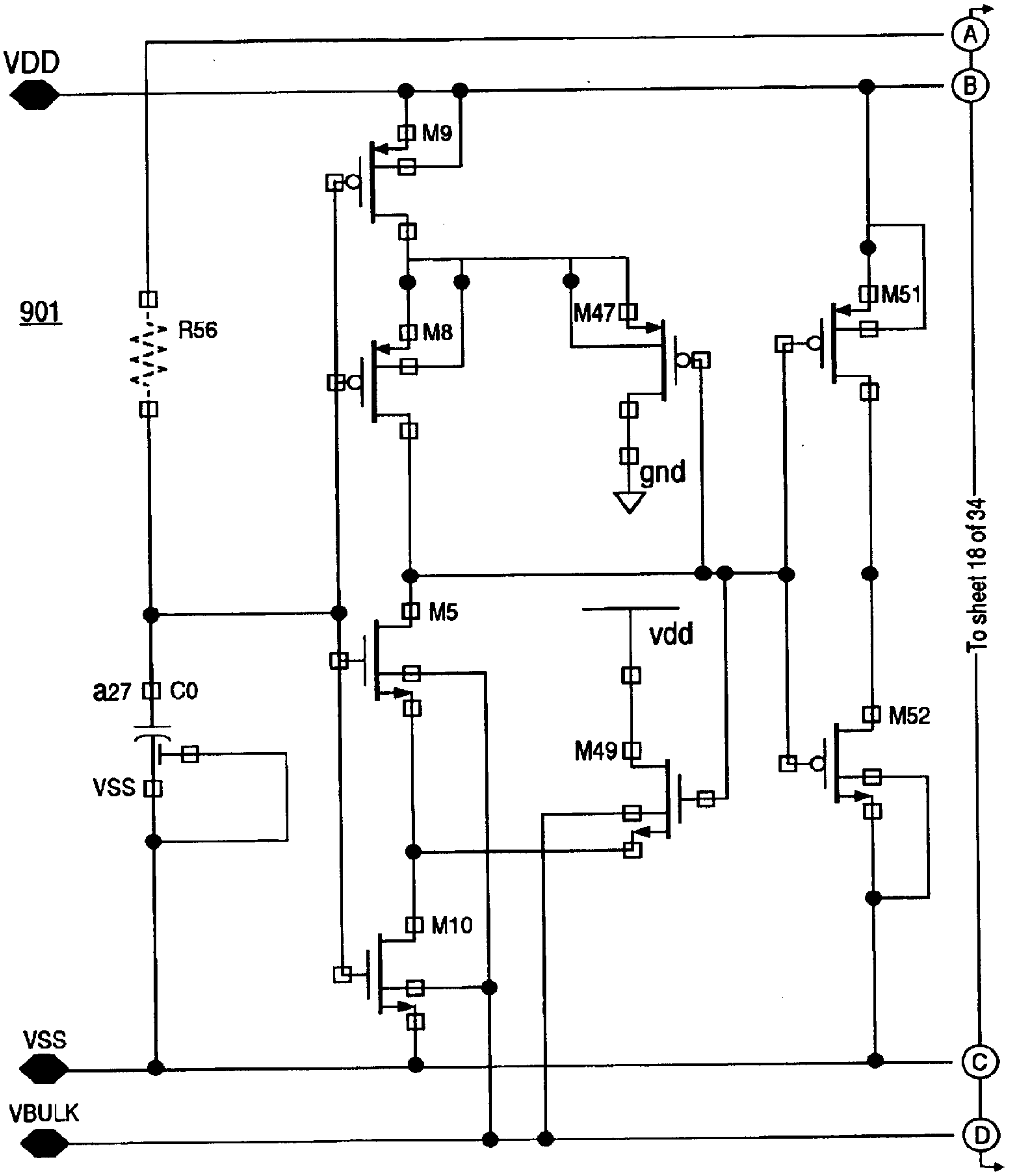
FIG. 10 is a schematic diagram of one embodiment of an oscillator that may be implemented as part of the present invention.
Figure 10:
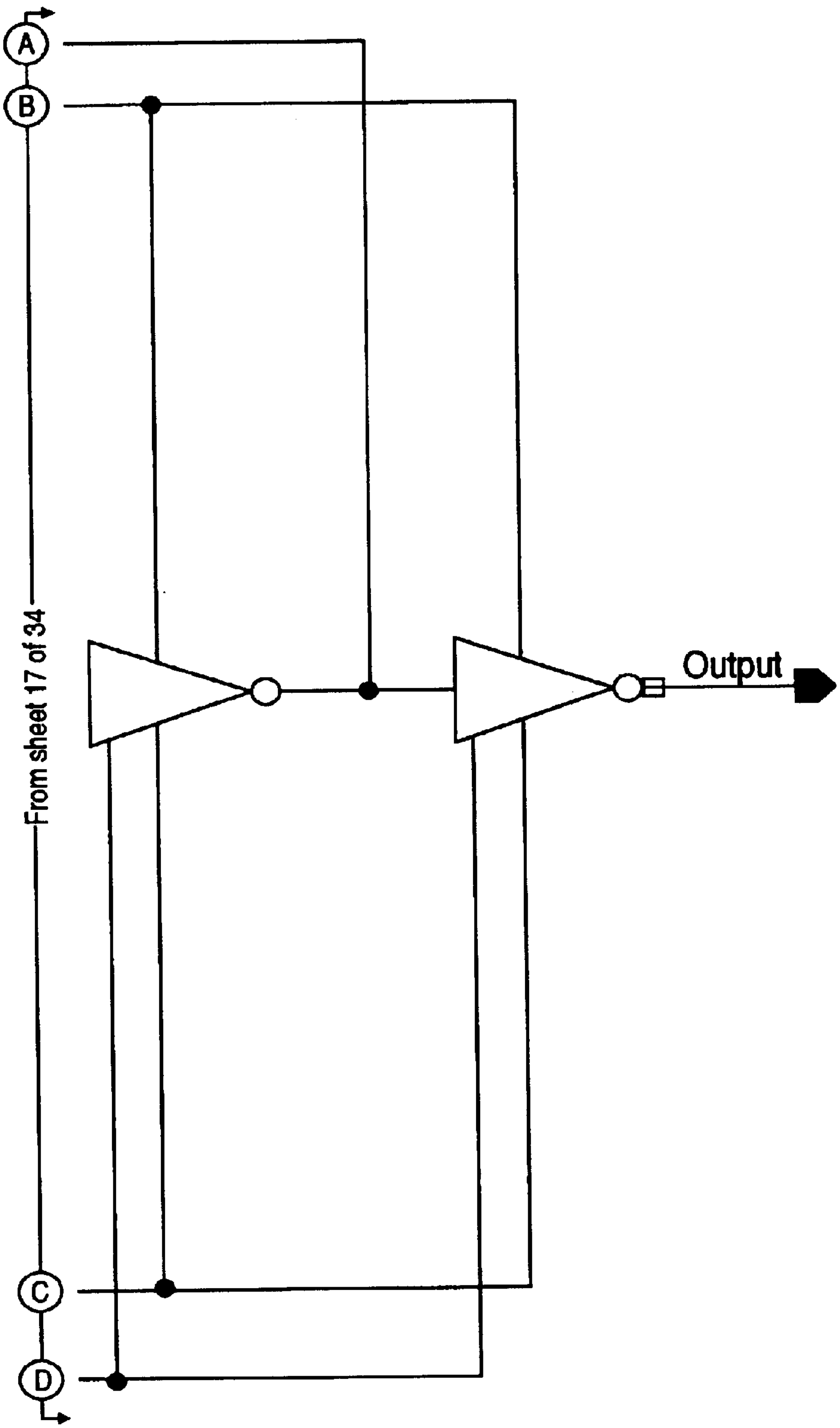
Figure 11:
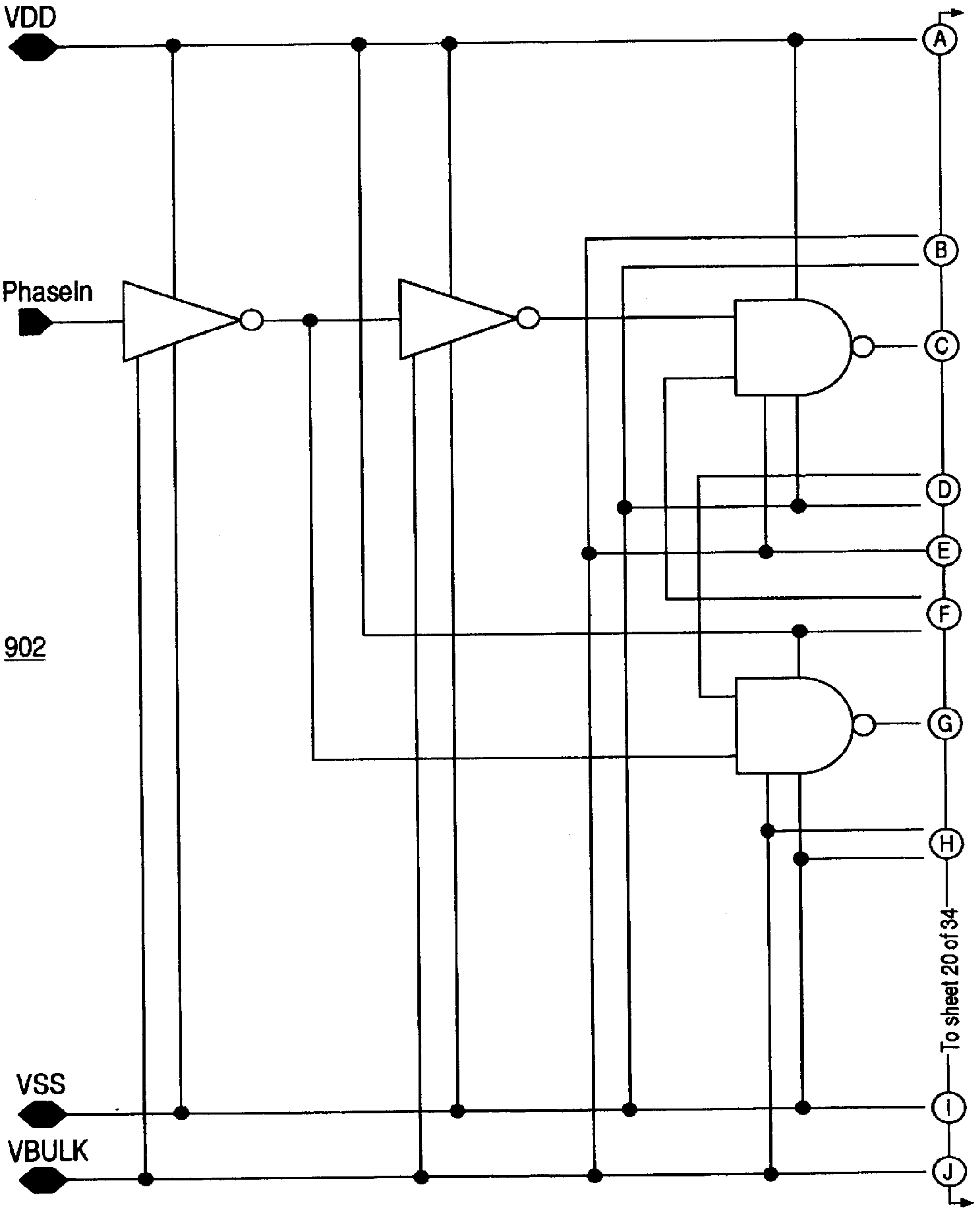
FIG. 11 is a schematic diagram of one embodiment of a phase generator that may be implemented as part of the present invention.
Figure 11:
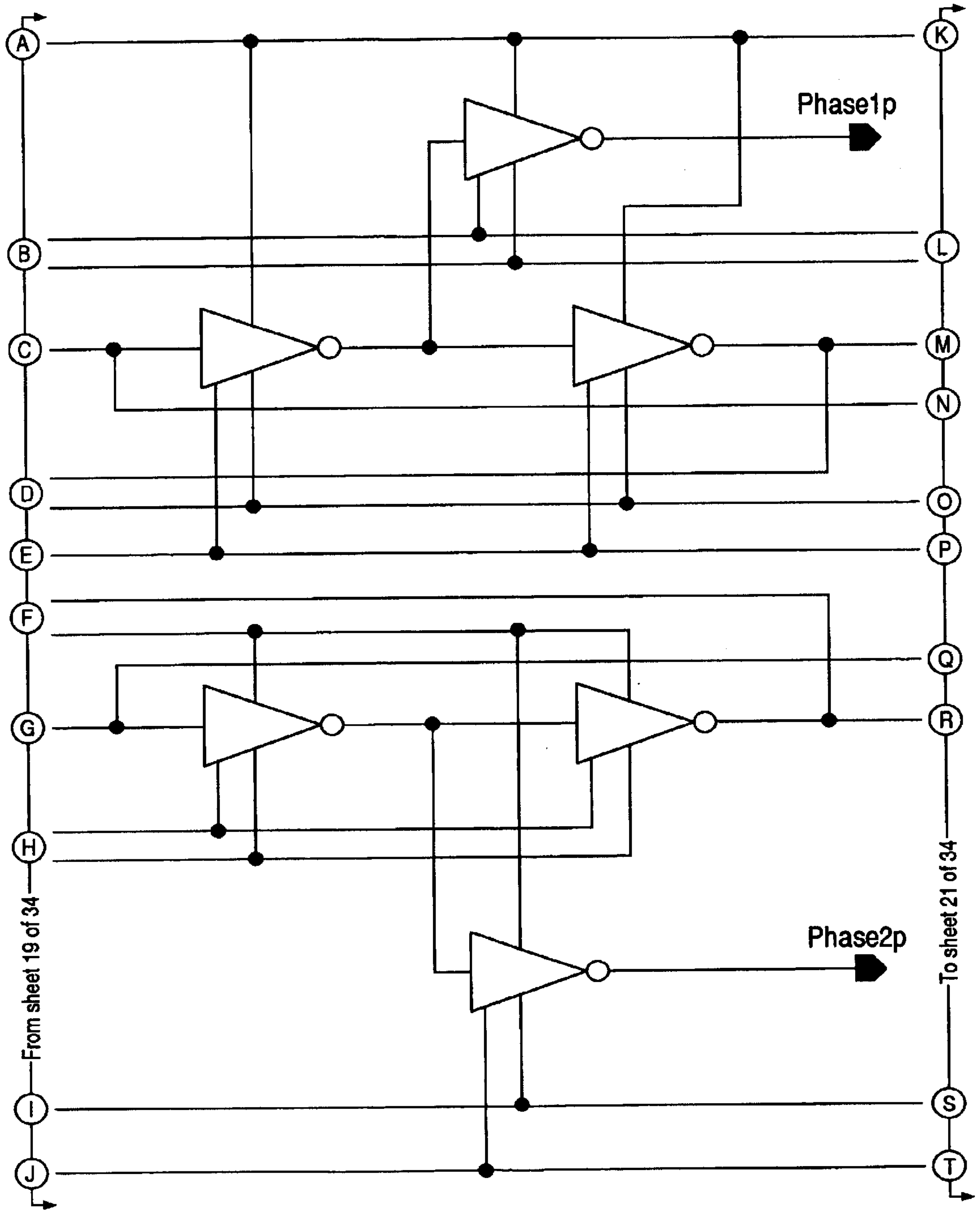
Figure 11:
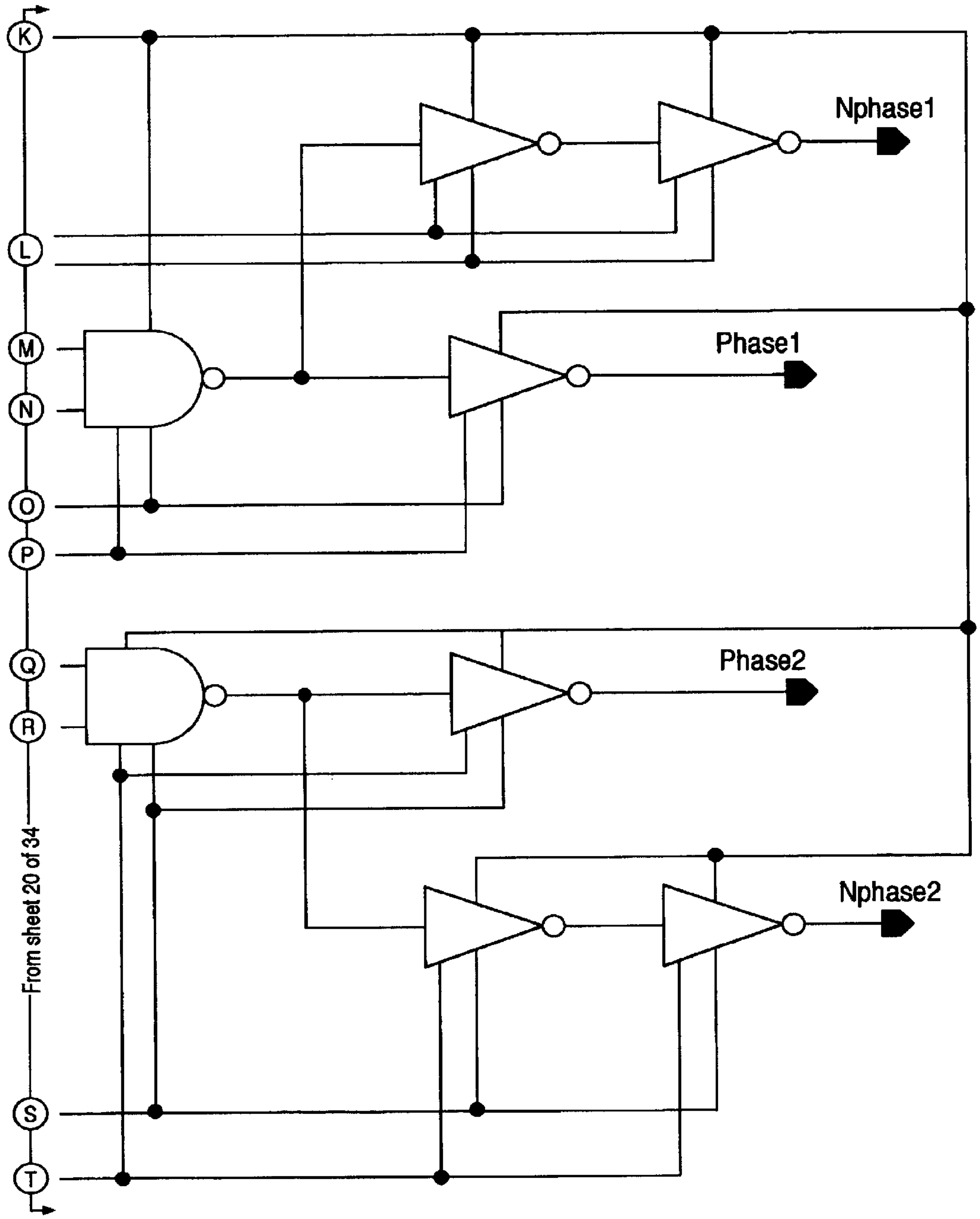
Figure 12:
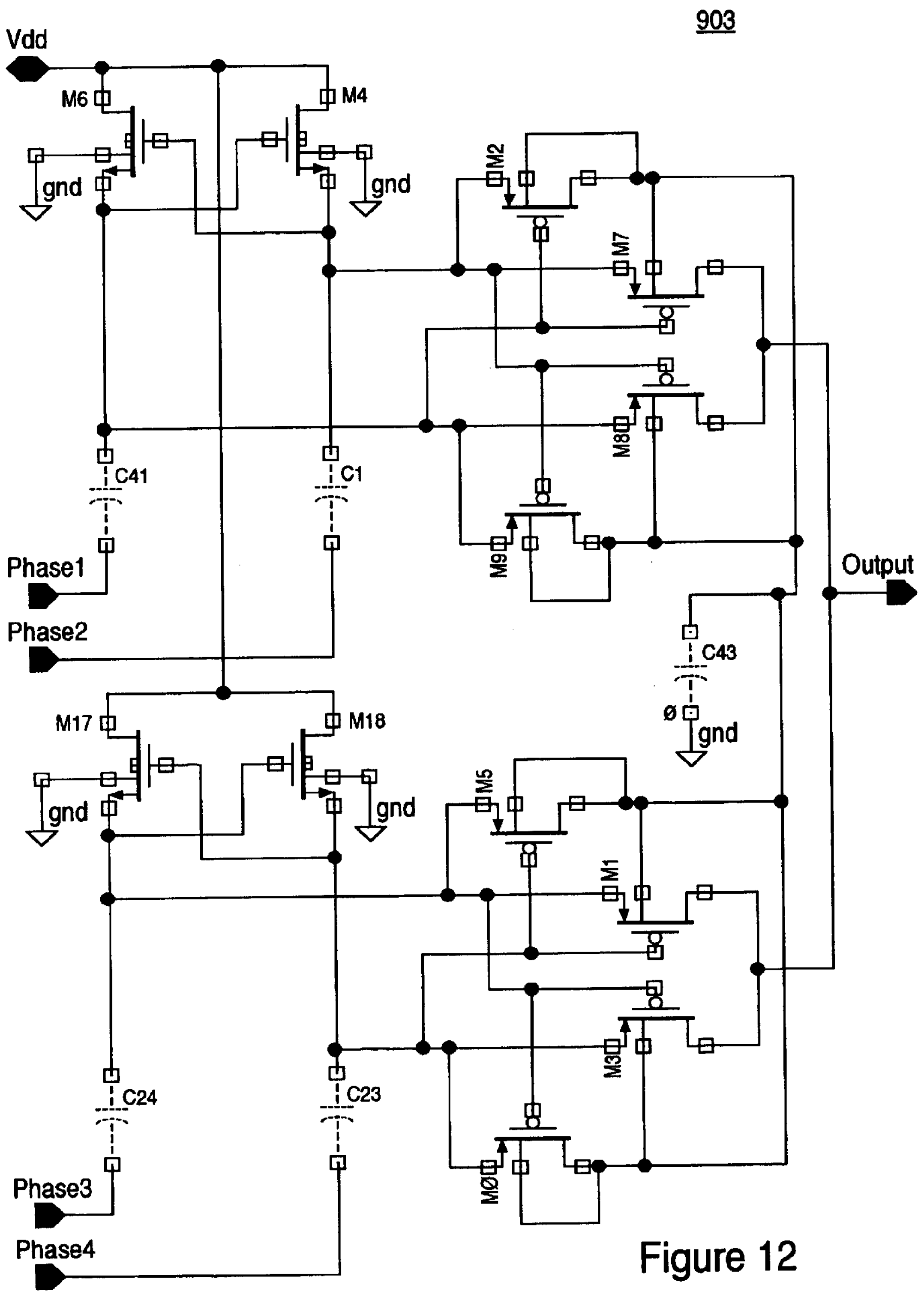
FIG. 12 is a schematic diagram of one embodiment of a voltage doubler that may be implemented as part of the present invention.

FIG. 10 is a schematic diagram of one embodiment of oscillator 901 that may be implemented as part of the present invention. FIG. 11 is a schematic diagram of one embodiment of phase generator 902 that may be implemented as part of the present invention. FIG. 12 is a schematic diagram of one embodiment of voltage doubler 903 that may be implemented as part of the present invention.

Figure 13:
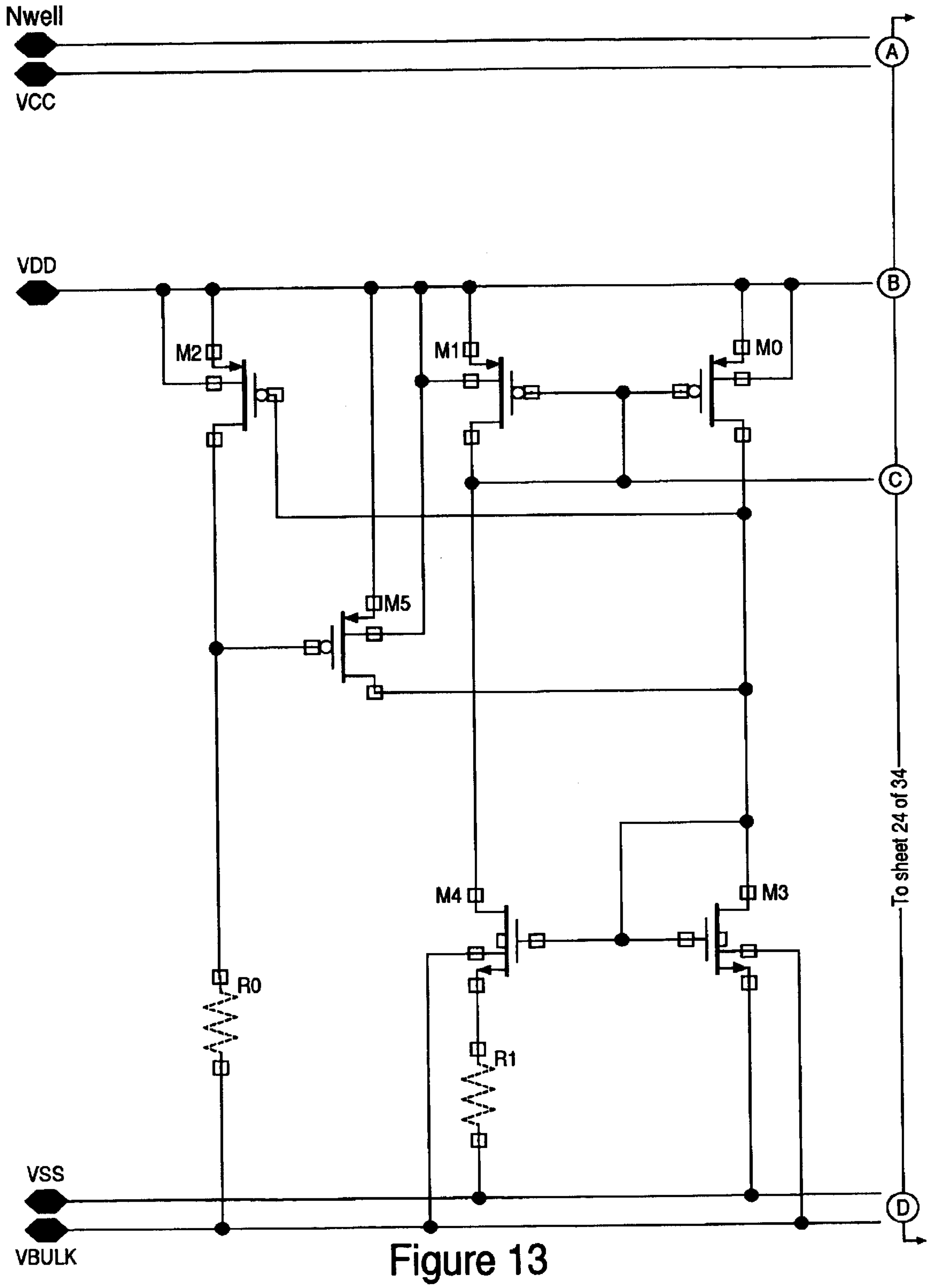
FIG. 13 is a schematic diagram further illustrating one embodiment of an input stage for the operational amplifier of FIG. 9 that may be implemented as part of the present invention.
Figure 13:
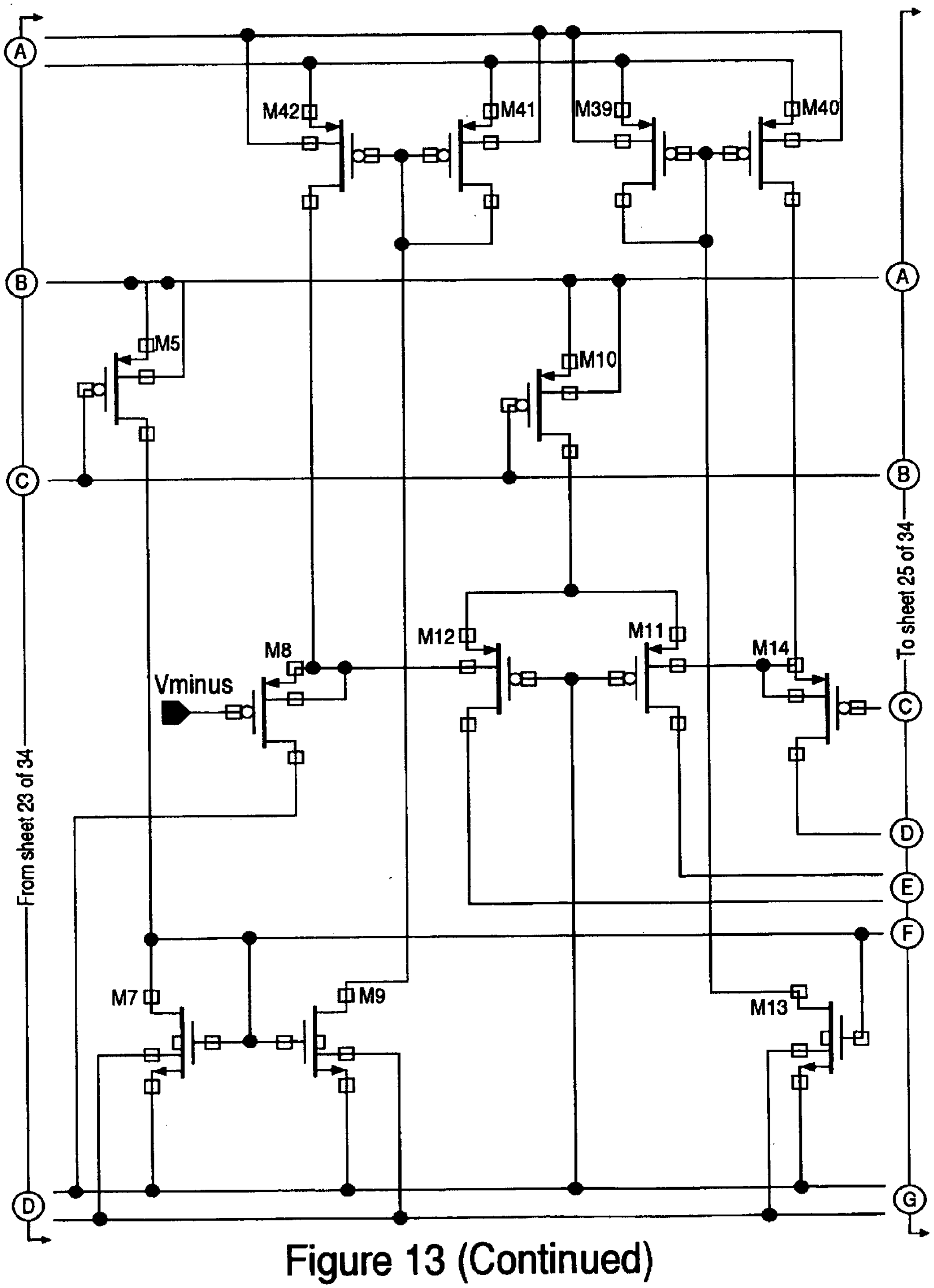
Figure 13:
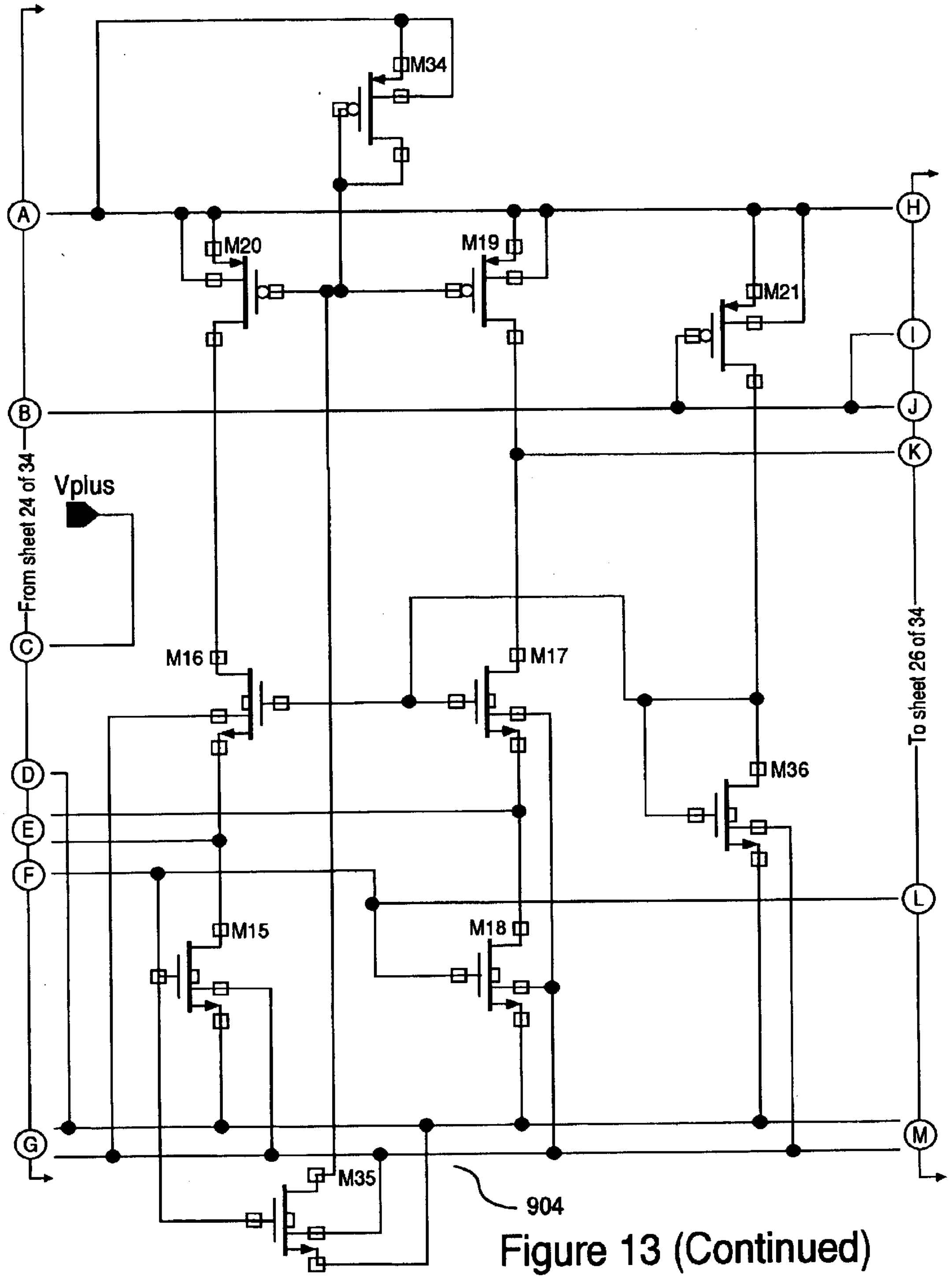
Figure 13:
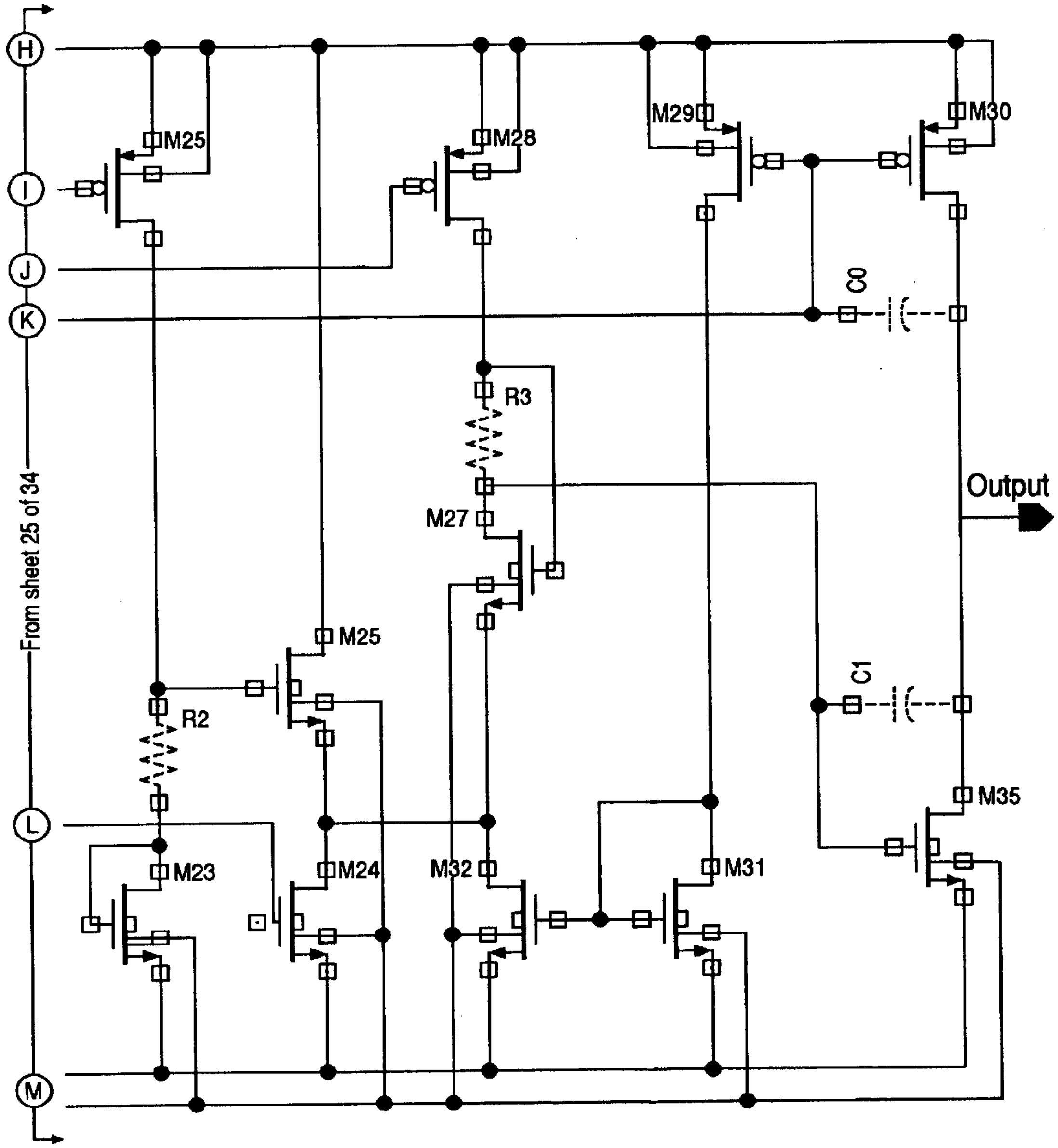

FIG. 13 is a schematic diagram further illustrating one embodiment of input stage 904 that may be implemented as part of the present invention. In this embodiment, full rail-to-rail operation is achieved with a supply voltage of less than one volt.

The embodiments of a sub-bandgap circuit described above furnish a stable reference voltage with an operating supply voltage less than the bandgap potential and also less than a zero-bias threshold voltage. Some of the key elements of the sub-bandgap circuit include a sub-threshold current reference with forward biasing of the P-channel bodies, a Gmb-based op-amp, and a zero current POR. Because of the averaging nature of this approach ((Vbe+ΔVbe·A)/2), the sensitivity to manufacturing tolerances is reduced, resulting in an inherent improvement in yields and reduced sensitivities to process voltages and temperatures (PVT). In effect, the sub-bandgap mode of operation is made superior to the bandgap operating at lower voltages and power and described elsewhere. Another advantage is that the circuit designs presented herein lend themselves to standard CMOS fabrication techniques in relatively high threshold processes, which are readily carried over to deep sub-micron digital processes.

SUB-BANDGAP CIRCUIT USING FIELD EFFECT TRANSISTORS IN LIEU OF RESISTORS AND DIODES

Figure 14A:
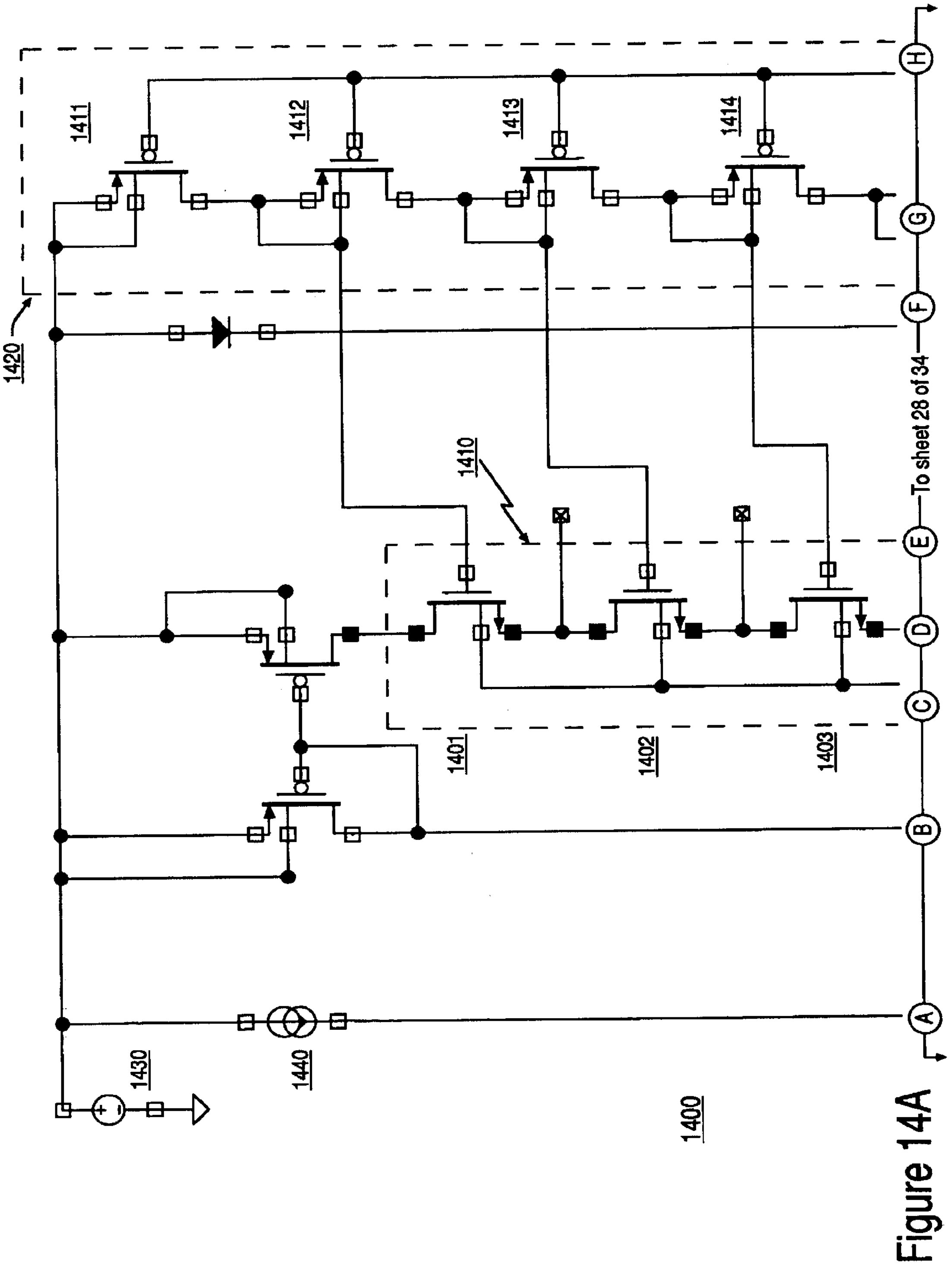
FIG. 14A is a schematic diagram illustrating field effect transistors (FETs) that can be used in place of a resistor according to one embodiment of the present invention.
Figure 14A:
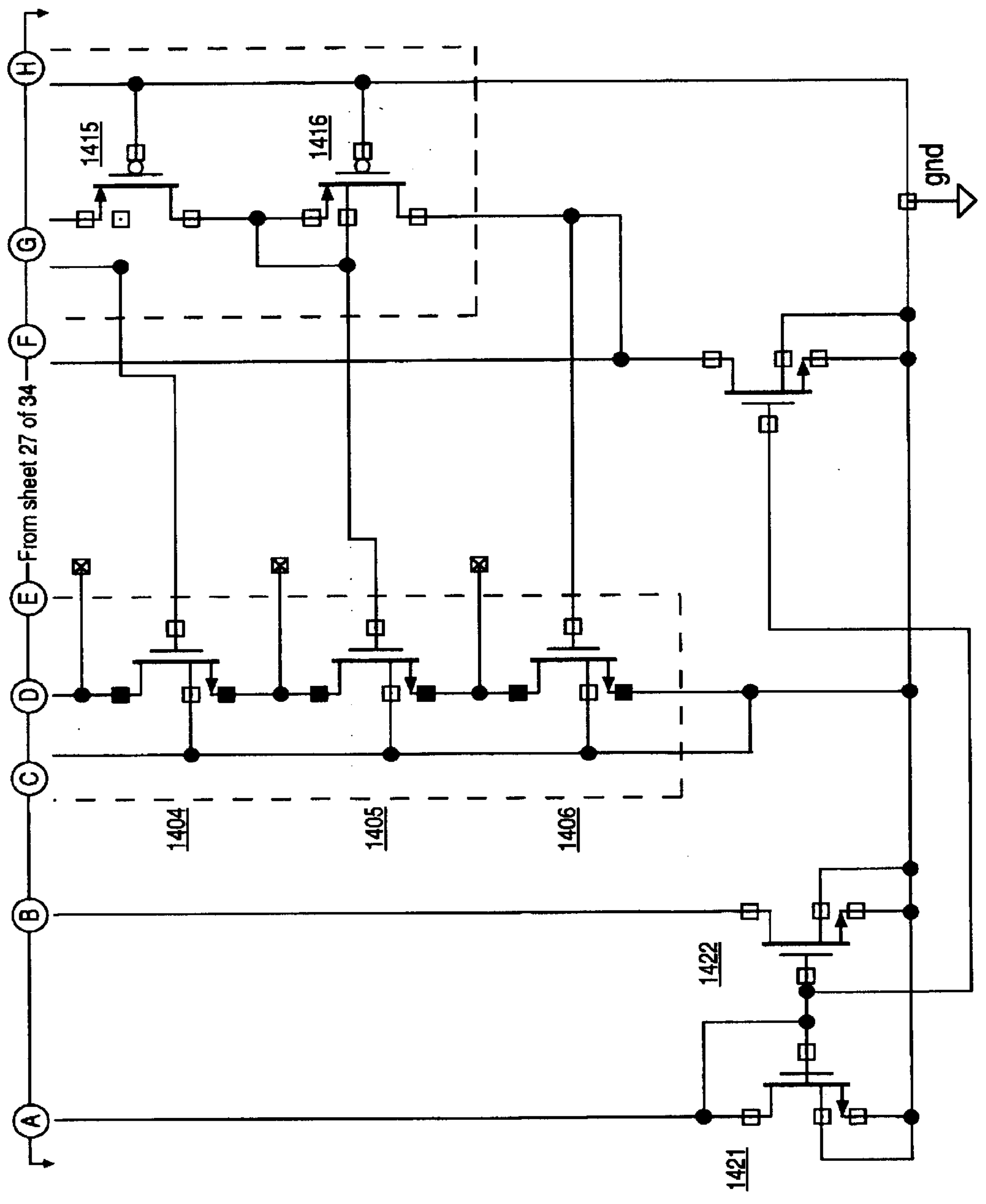

FIG. 14A is a schematic diagram illustrating field effect transistors (FETs) that can be used in place of a resistor according to one embodiment of the present invention. The circuit 1400 of FIG. 14A includes a first plurality 1410 of FETs 1401, 1402, 1403, 1404, 1405 and 1406 that are coupled in series ("stacked"), with the drain node of one FET coupled to the source node of the preceding FET. For example, the drain node of FET 1402 is coupled to the source node of FET 1401. In the present embodiment, FETs 1401–1406 are N-channel FETs.

The circuit 1400 of FIG. 14A also includes a second plurality 1420 of FETs 1411, 1412, 1413, 1414, 1415 and 1416 coupled in series, with the drain node of one FET coupled to the source node of the preceding FET. For example, the drain node of FET 1415 is coupled to the source node of FET 1416. In the present embodiment, FETs 1411–1416 are P-channel FETs.

The second plurality 1420 of FETs (1411–1416) are coupled essentially in parallel with the first plurality 1410 of FETs (1401–1406). In the present embodiment, the source node of each FET In the second plurality 1420 of FETs is coupled to the gate node of a respective FET in the first plurality 1410 of FETs. For example, the source node of FET 1412 is coupled to the gate node of FET 1401. Also in the present embodiment, the gate node of each FET in the second plurality 1420 of FETs is coupled to ground.

In essence, the first plurality 1410 of FETs 1401–1406 and the second plurality 14420 of FETs 1411–1416 operate in tandem to provide the functionality of a resistor. Generally speaking, the FETs 1401–1406 and 1411–1416 are equivalent to a resistor when one side (e.g., first plurality 1410 of FETs 1401–1406) is tied to the supply voltage (VDD) and/or the other side (e.g., second plurality 1420 of FETs 1411–1416) is tied to ground.

In operation, the first plurality 1410 of FETs 1401–1406 acts to provide a prescribed amount of voltage drop, while the second plurality 1420 of FETs 1411–1416 acts to control the gate drive voltages on the first plurality of FETs. Different gate drive voltages can be applied to each of the first plurality of FETs 1401–1406. In one embodiment, the voltage drop across each FET 1401–1406 is substantially equal. That is, for example, the voltage drop across FET 1401 is approximately equal to the voltage drop across FET 1402, and so on.

In one embodiment, the total voltage drop across FETs 1401–1406 is approximately 0.6 volts. In one such embodiment, the voltage drop across each of the FETs 1401–1406 is approximately 0.1 volts.

Figure 14B:
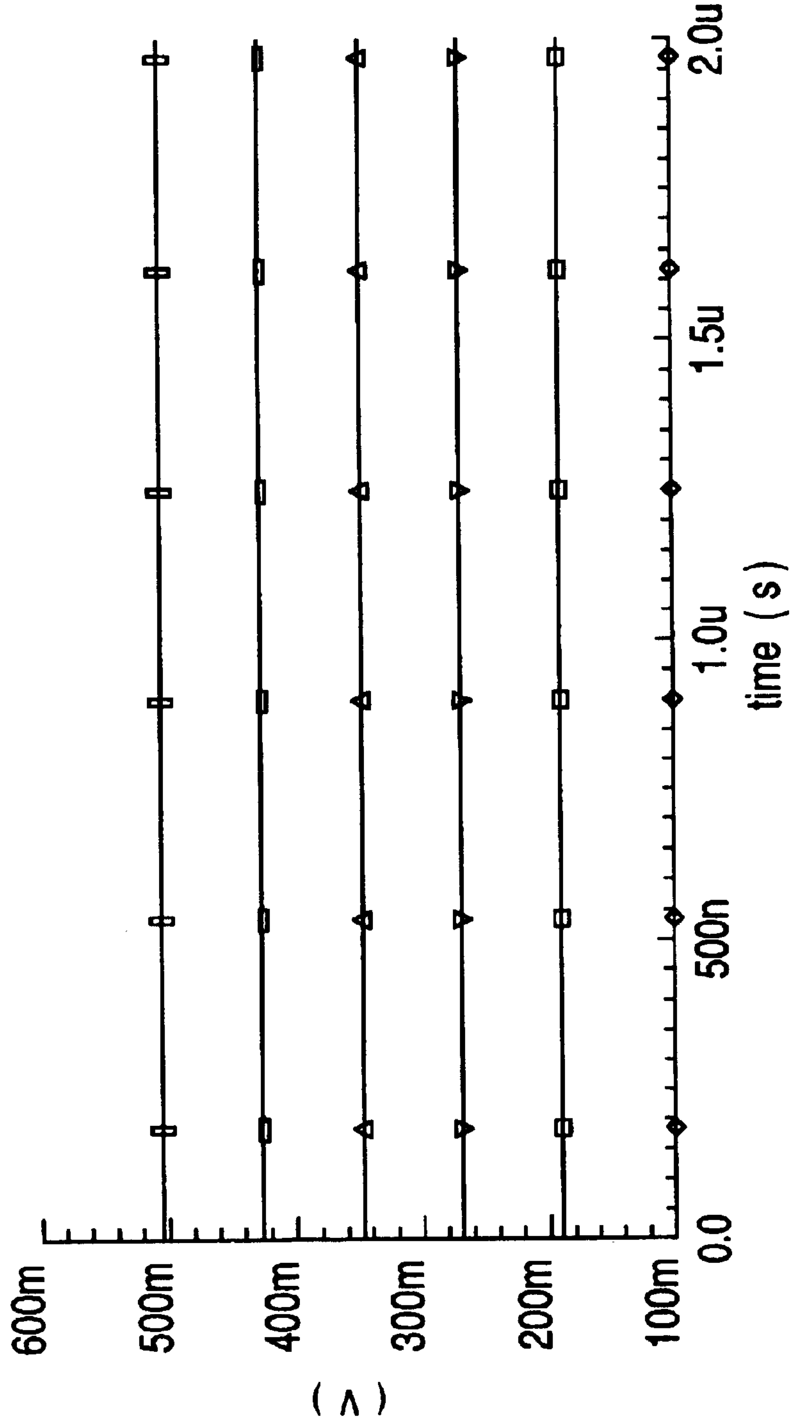
FIG. 14B illustrates simulation results using FETs as a resistor in accordance with one embodiment of the present invention.

FIG. 14B illustrates simulation results using FETs as a resistor in accordance with one embodiment of the present invention. Specifically, FIG. 14B shows the voltage drop across each of the FETs 1401–1406 of FIG. 14A with a current of 2.5 micro-amps. In the present embodiment, the voltage drop across each FET is approximately 0.1 volts (100 milli-volts).

With reference back to FIG. 14A, it is appreciated that any number of FETs may be coupled in series to form the first and second plurality of FETs. Generally, the number of FETs in the first plurality and the number of FETs in the second plurality are equal. It is also appreciated that different voltage drops can be achieved by either varying the number of FETs or by varying the characteristics of the FETs.

As described, in one embodiment, a total voltage drop of 0.6 volts is selected. To use FETs lo achieve the functionality of a resistor, it is desirable for the FETs to operate in a linear voltage region (e.g., less than approximately 100–200 millivolts).

Figure 14C:
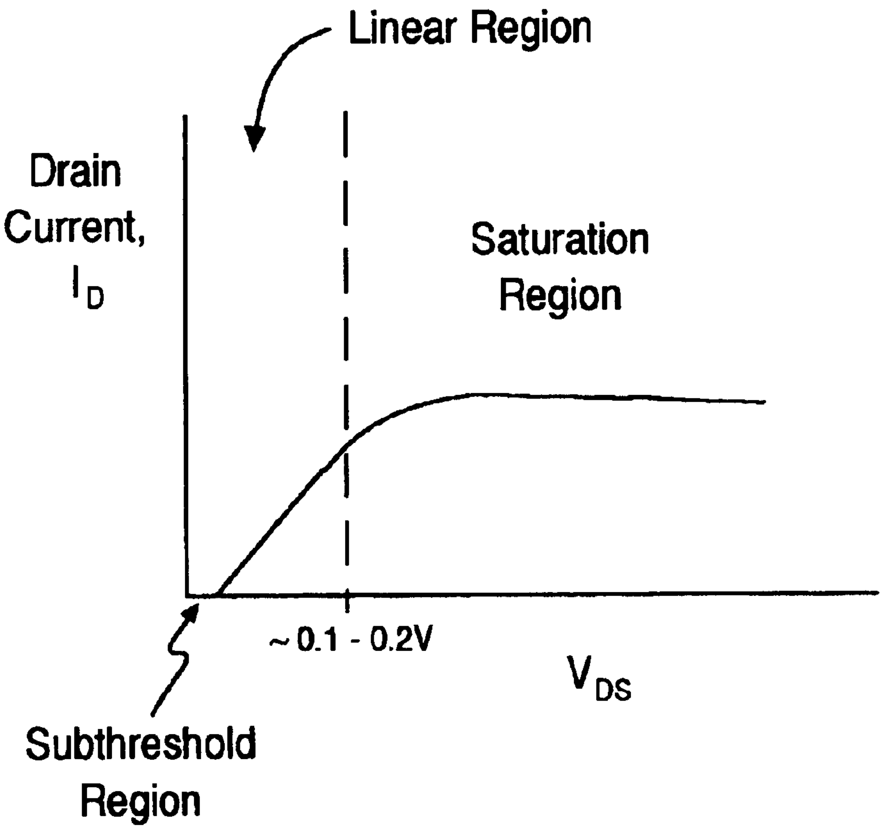
FIG. 14C is a diagram illustrating a linear voltage region of operation according to one embodiment of the present invention.

The linear region of operation is illustrated in FIG. 14C. In the linear region, the change in current across a drain node is linear. To operate a FET in the linear region, it is desirable for the source-drain voltage ($V_{DS}$) to be much less than the gate voltage; if the source-drain voltage is greater than the gate voltage, the FET will operate in a saturation region. A voltage drop of 0.6 volts across a single FET is expected to place the FET outside of the linear region. Hence, a number of FETs are stacked to achieve the selected total voltage drop with operation in the linear region. As mentioned, in one embodiment, six FETs are stacked to achieve the selected total voltage drop within the linear region of operation.

It is understood that circuit 1400 of FIG. 14A may be alternatively arranged. In particular, circuit 1400 may include triple well devices. The use of N-channel devices in the first plurality of FETs may be advantageous because the N-channel threshold voltage is lower than that of the P-channel; thus, N-channel devices afford a greater supply operating range. In the present embodiment, operation is intended with a 1.5-volt supply with N-channel thresholds of approximately 0.7 volts. To maintain these operating conditions, a channel width to channel length (W/L) ratio of approximately one is used, achieving an effective linear resistance region of approximately 100K ohms. The values of channel width and length can be varied if the ratio (W/L) is maintained.

With reference to FIG. 14A, in the present embodiment, circuit 1400 includes a voltage source 1430, a current source 1440, and FETs 1421 and 1422. FETs 1421 and 1422 function as a current mirror so that the first and second plurality of FETs are driven by FETs. As discussed above, the first and second plurality of FETs 1401–1406 and 1411–1416 can be used in a circuit (specifically, a sub-bandgap circuit) to provide the functionality of a resistor. In that case, the voltage and/or current source of the sub-bandgap circuit would be used.

Figure 15:
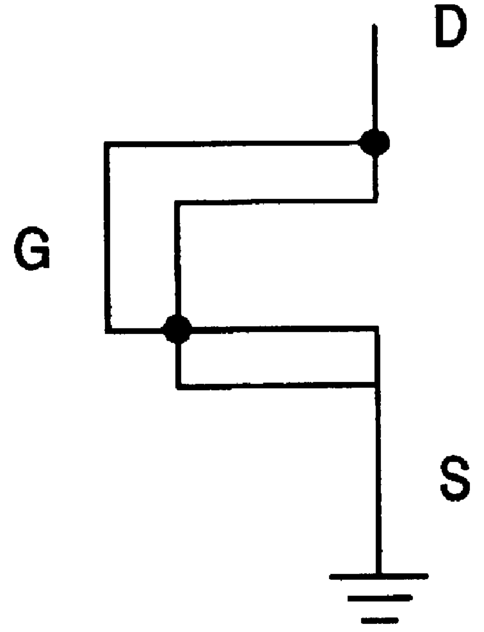
FIG. 15 is a schematic diagram illustrating a FET that can be used in place of a diode according to one embodiment of the present invention.

FIG. 15 is a schematic diagram illustrating a FET 1500 that can be used in place of a diode according to one embodiment of the present invention. In the present embodiment, the gate node of FET 1500 is tied to its drain node. As such, in the sub-threshold region of operation, FET 1500 will function as a diode. That is, for low currents (e.g., less than approximately one micro-amp), FET 1500 is equivalent to a diode.

Figure 16:
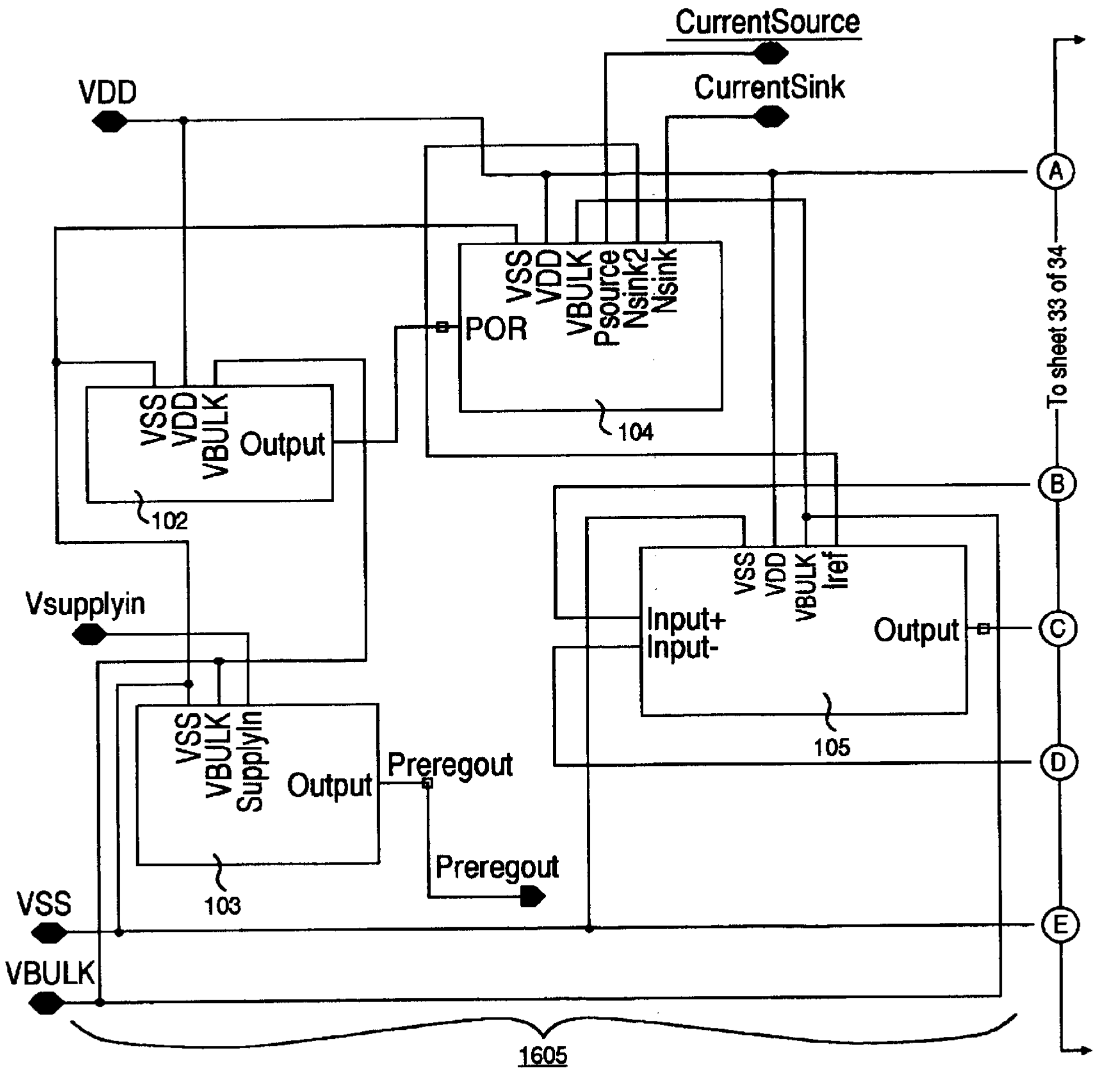
FIG. 16 is a schematic diagram showing one embodiment of a sub-bandgap circuit incorporating FETs in lieu of resistors and diodes in accordance with one embodiment of the present invention.
Figure 16:
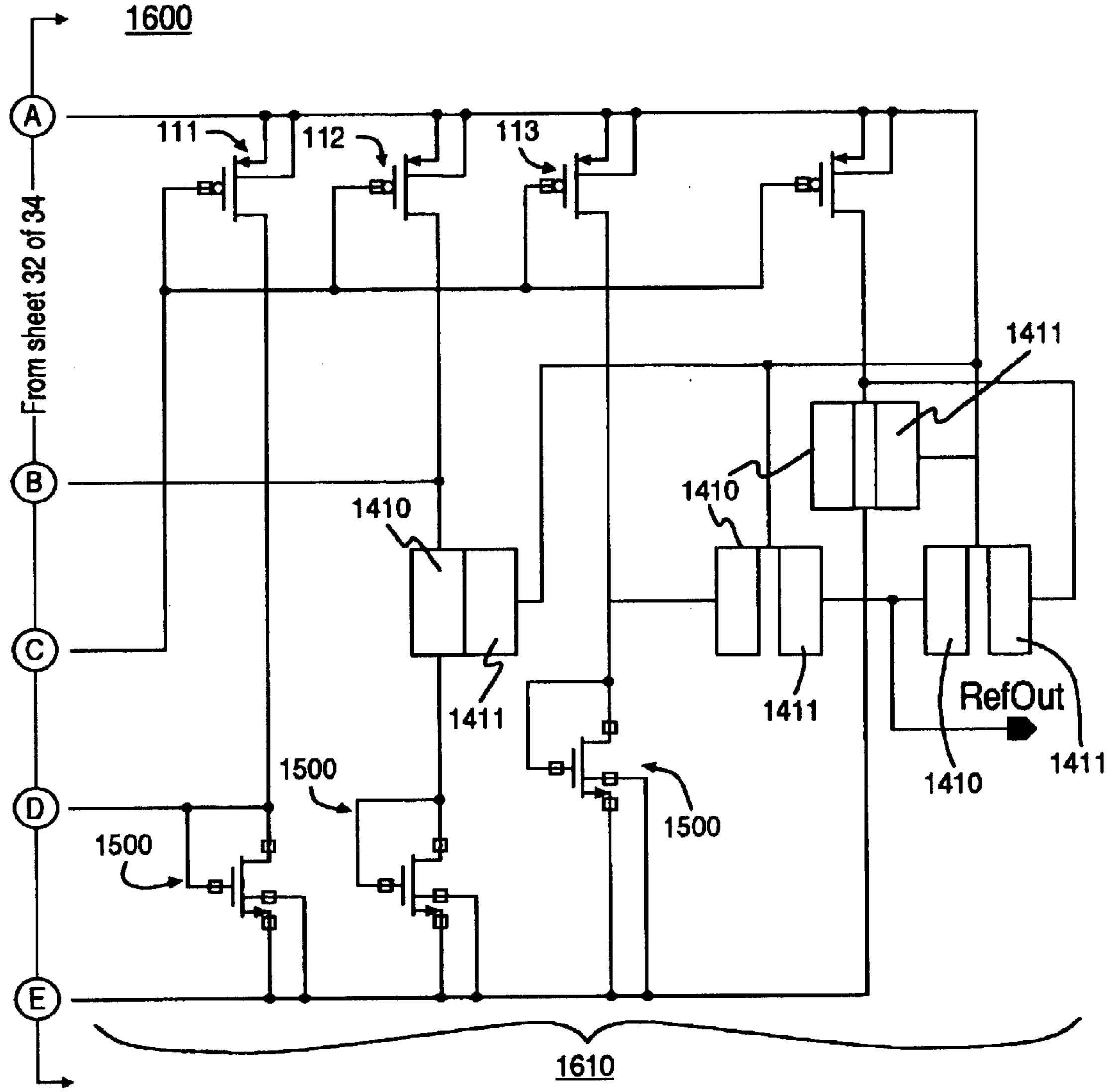

FIG. 16 is a schematic diagram showing one embodiment of a sub-bandgap circuit 1600 incorporating FETs in lieu of resistors and diodes in accordance with one embodiment of the present invention. A comparison of the sub-bandgap circuit of FIG. 16 to the sub-bandgap circuit of FIG. 1 indicates that the diodes of FIG. 1 are replaced by diode-equivalent FETs 1500 (refer also to FIG. 15), and that the resistors of FIG. 1 are replaced by resistor-equivalent FET pluralities 1410 and 1411 (refer also to FIG. 14A). Sub-bandgap circuit 1600, in essence, includes a first portion of circuitry 1605 and a second portion of circuitry 1610. The first portion of circuitry 1605 includes a power-on reset block 102, a pre-regulator block 103, a current source block 104, and an operational amplifier block 105. In the second portion of circuitry 1610, the diodes and the resistors are replaced by FETs such that, in the present embodiment, there are no resistors or diodes in the second portion of circuitry 1610.

Figure 17:
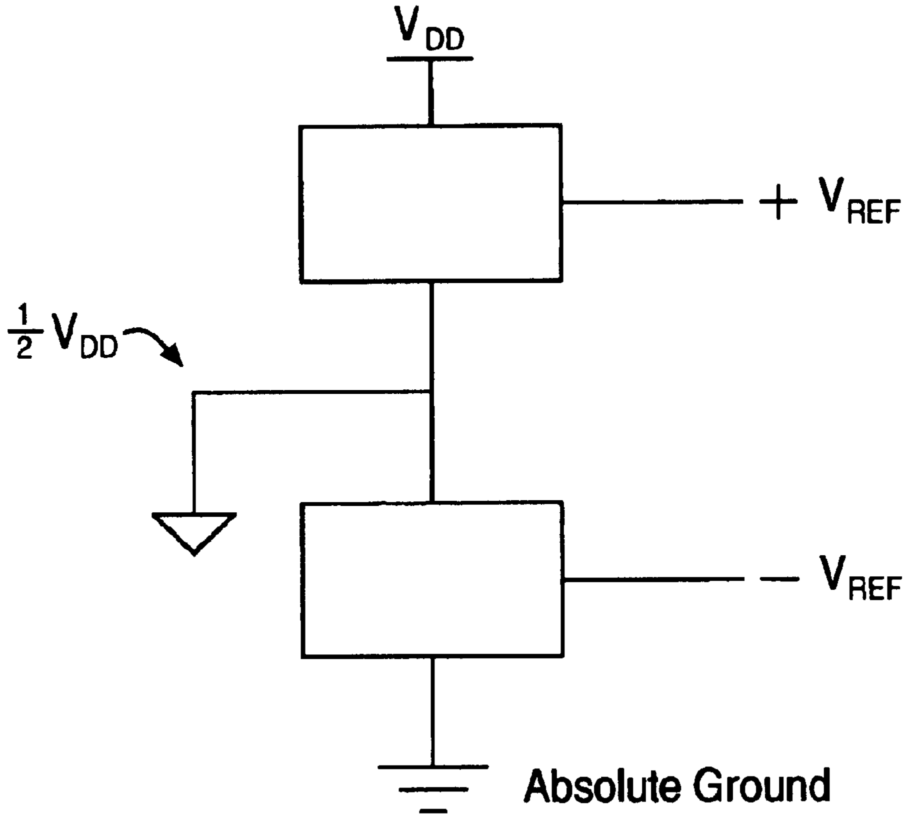
FIG. 17 illustrates a fully differential implementation of a reference circuit according to one embodiment of the present invention.

The above discussion generally pertains to embodiments of the present invention realized as single-ended references. However, it is appreciated that, in alternate embodiments, the present invention may be realized as a fully differential reference with improved power supplies, for applications such as communications codecs which require PSRR is excess of 90 dB. One skilled in the art should be able to convert a single-ended implementation into a fully differential implementation. FIG. 17 illustrates one embodiment of a fully differential implementation of a reference circuit according to one embodiment of the present invention.

According to the various embodiments of the present invention, power down circuits have been eliminated, but use of such circuits are implicit and realization of such circuits are within the capabilities of those skilled in the art. Power down recovery times on the order of less than ten micro-seconds have been measured.

In summary, in one embodiment, FETs are used to replace resistors and/or diodes in at least a portion of a sub-bandgap circuit. As such, costs can be reduced and the speed and longevity of the circuit can be increased. Moreover, the FETs are relatively small and are compatible with deep sub-micron processes.

Embodiments of the present invention are thus described. While the present invention has been described in particular embodiments, it should be appreciated that the present invention should not be construed as limited by such embodiments, but rather construed according to the below claims.

What is claimed is:

1. A circuit comprising:

a first plurality of field effect transistors (FETs) coupled in series, source node to drain node; and a second plurality of FETs coupled in series, source node to drain node;

wherein the source node of a FET in said second plurality of FETs is coupled to the gate node of a respective FET in said first plurality of FETs and wherein the gate node of each FET in said second plurality of FETs is coupled to ground such that a specified total voltage drop across said first plurality of FETs is realizable; and wherein in combination said first and second plurality of FETs are usable as a replacement for a resistor.

2. The circuit of claim 1 wherein a voltage drop across each FET in said first plurality of FETs is substantially equal.

3. The circuit of claim 2 wherein said voltage drop across said each FET is approximately 0.1 volts.

4. The circuit of claim 1 wherein said first plurality of FETs and said second plurality of FETs each comprise six FETs.

5. The circuit of claim 1 wherein said specified total voltage drop is approximately 0.6 volts.

6. A circuit comprising:

first circuitry comprising:

a current source; and an operational amplifier coupled to said current source; and second circuitry coupled to said first circuitry, said second circuitry comprising:

a plurality of field effect transistors (FETs) configured to function as equivalent to a resistor, wherein said plurality of FETs comprises:

a first number of FETs coupled in series, source node to drain node; and a second number of FETs coupled in series, source node to drain node;

wherein the source node of a FET in said second number of FETs is coupled to the gate node of a respective FET in said first number of FETs and wherein the gate node of each FET in said second number of FETs is coupled to ground such that a specified total voltage drop across said first number of FETs is realizable.

7. The circuit of claim 6 wherein a voltage drop across each FET in said first number of FETs is substantially equal.

8. The circuit of claim 7 wherein said voltage drop across said each FET is approximately 0.1 volts.

9. The circuit of claim 6 wherein said first number of FETs and said second number of FETs each comprise six FETs.

10. The circuit of claim 6 wherein said specified total voltage drop is approximately 0.6 volts.

11. The circuit of claim 6 wherein said second circuitry comprises no diodes, wherein diode functionality is instead provided by a FET.

12. The circuit of claim 6 wherein said first circuitry further comprises:

a power-on reset coupled to said current source; and a pre-regulator coupled to said power-on reset.

13. The circuit of claim 6 wherein said circuit is adapted to function as a differential reference.

14. The circuit of claim 6 wherein said circuit is adapted to function as a single-ended reference.

15. The circuit of claim 6 wherein said second circuitry comprises no resistors, wherein resistor functionality is instead provided by a combination of FETs.

16. A circuit comprising:

first circuitry comprising:

a power-on reset;

a pre-regulator coupled to said power-on reset;

a current source coupled to said power-on reset; and an operational amplifier coupled to said power-on reset; and second circuitry coupled to said first circuitry, said second circuitry comprising:

a plurality of field effect transistors (FETs) configured to function as equivalent to a resistor; and a FET configured to function as equivalent to a diode, wherein said second circuitry comprises no resistors and no diodes.

17. The circuit of claim 16 wherein said plurality of FETs comprise:

a first number of FETs coupled in series, source node to drain node; and a second number of FETs coupled in series, source node to drain node;

wherein the source node of a FET in said second number of FETs is coupled to the gate node of a respective FET in said first number of FETs and wherein the gate node of each FET in said second number of FETs is coupled to ground such that a specified total voltage drop across said first number of FETs is realizable.

18. The circuit of claim 17 wherein said specified total voltage drop is approximately 0.6 volts.

19. The circuit of claim 17 wherein a voltage drop across each FET in said first number of FETs is substantially equal.

20. The circuit of claim 19 wherein said voltage drop across said each FET is approximately 0.1 volts.

21. The circuit of claim 17 wherein said first number of FETs and said second number of FETs each comprise six FETs.

22. The circuit of claim 16 wherein the gate node and the drain node of said FET providing diode functionality are coupled.

23. The circuit of claim 16 wherein said circuit is adapted to function as a differential reference.

24. The circuit of claim 16 wherein said circuit is adapted to function as a single-ended reference.

* * * * *